(12) United States Patent
Tanaka et al.

(10) Patent No.: US 11,789,088 B2
(45) Date of Patent: Oct. 17, 2023

(54) STATE CALCULATING APPARATUS AND STATE CALCULATING METHOD FOR BATTERY

(71) Applicant: Prime Planet Energy & Solutions, Inc., Tokyo (JP)

(72) Inventors: Yasuharu Tanaka, Ibaraki (JP); Hiroya Murao, Himeji (JP); Ryuji Nagata, Takatsuki (JP)

(73) Assignee: PRIME PLANET ENERGY & SOLUTIONS, INC., Tokyo (JP)

( * ) Notice: Subject to any disclaimer, the term of this patent is extended or adjusted under 35 U.S.C. 154(b) by 0 days.

(21) Appl. No.: 17/694,692

(22) Filed: Mar. 15, 2022

(65) Prior Publication Data

US 2022/0299573 A1     Sep. 22, 2022

(30) Foreign Application Priority Data

Mar. 18, 2021   (JP) ................. 2021-044457

(51) Int. Cl.
*G01R 31/389* (2019.01)
*G01R 31/3842* (2019.01)
*G01R 31/374* (2019.01)

(52) U.S. Cl.
CPC ......... *G01R 31/389* (2019.01); *G01R 31/374* (2019.01); *G01R 31/3842* (2019.01)

(58) Field of Classification Search
None
See application file for complete search history.

(56) References Cited

U.S. PATENT DOCUMENTS

| 4,697,134 A * | 9/1987 | Burkum ............... G01R 31/389 340/636.15 |
| 2002/0008506 A1* | 1/2002 | Nakada ................ H04B 17/327 324/120 |
| 2008/0169819 A1* | 7/2008 | Ishii ..................... G01R 31/389 324/430 |
| 2008/0303528 A1* | 12/2008 | Kim ..................... G01R 31/385 324/430 |
| 2017/0131359 A1 | 5/2017 | Kizler et al. |
| 2017/0254860 A1* | 9/2017 | Stolczenberger .... G01R 31/389 |
| 2020/0072909 A1 | 3/2020 | Soejima et al. |

FOREIGN PATENT DOCUMENTS

| EP | 1650575 A1 | 4/2006 |
| EP | 3617726 A1 | 3/2020 |
| JP | H9-232005 A | 9/1997 |

(Continued)

*Primary Examiner* — Jas A Sanghera
(74) *Attorney, Agent, or Firm* — HAUPTMAN HAM, LLP

(57) ABSTRACT

A BMU, which is a battery management unit, includes a current measuring unit that measures a current charged to and discharged from a battery; a voltage measuring unit that measures a voltage of the battery during measurement of the current by the current measuring unit; a BPF processing unit that extracts a component in a prescribed frequency band, of the current measured by the current measuring unit; a BPF processing unit that extracts a component in the prescribed frequency band, of the voltage measured by the voltage measuring unit; and an impedance calculating unit that calculates an impedance of the battery using the extracted current component and voltage component.

16 Claims, 29 Drawing Sheets

(56) References Cited

FOREIGN PATENT DOCUMENTS

| | | |
|---|---|---|
| JP | 2010-139423 A | 6/2010 |
| JP | 2017-516080 A | 6/2017 |
| JP | 2018-96803 A | 6/2018 |
| JP | 2020-34426 A | 3/2020 |
| JP | 202041917 A | 3/2020 |
| WO | 2012/118005 A1 | 9/2012 |

* cited by examiner

IMPLEMENTATION EXAMPLE OF BPF PROCESSING BY ANALOG CIRCUIT

IMPLEMENTATION EXAMPLE OF BPF PROCESSING BY DIGITAL PROCESSING
(BIQUADRATIC IIR FILTER)

IMPLEMENTATION EXAMPLE OF LPF PROCESSING BY ANALOG CIRCUIT

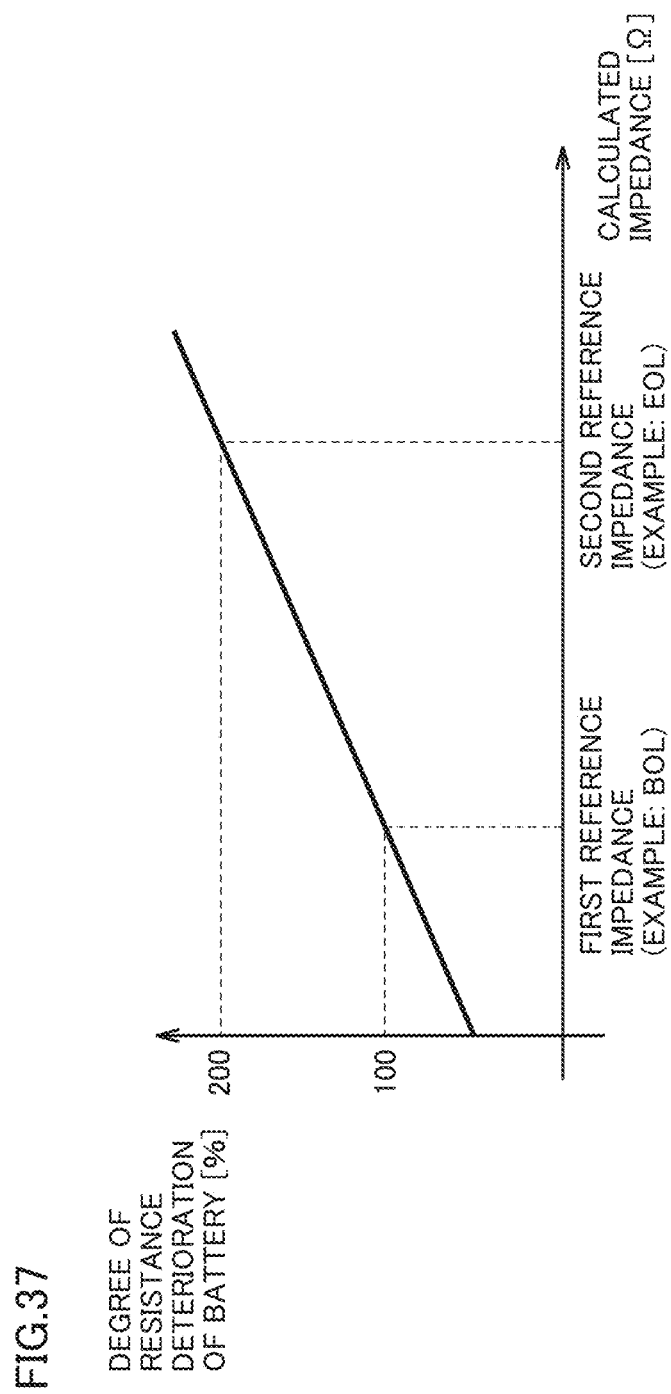

STATE CALCULATING APPARATUS AND STATE CALCULATING METHOD FOR BATTERY

This nonprovisional application is based on Japanese Patent Application No. 2021-044457 filed on Mar. 18, 2021 with the Japan Patent Office, the entire contents of which are hereby incorporated by reference.

BACKGROUND OF THE INVENTION

Field of the Invention

The present disclosure relates to the technique of calculating a resistance deterioration state of a chargeable and dischargeable battery.

Description of the Background Art

For example, Japanese Patent Laying-Open No. 2020-41917 discloses a method for calculating an impedance of a secondary battery (chargeable and dischargeable battery) in order to measure a degree of resistance deterioration of the secondary battery, in a vehicle including the secondary battery, a motor generator, and a power control unit (an inverter and a boost converter) that performs power conversion between the secondary battery and the motor generator. According to this method, driving of the power control unit that serves as a load of the secondary battery is controlled, thereby generating a power pattern having a prescribed frequency, and the generated power pattern is input to the secondary battery and the impedance of the secondary battery is calculated from a current or a voltage generated in the secondary battery.

SUMMARY OF THE INVENTION

In the method disclosed in Japanese Patent Laying-Open No. 2020-41917, it is necessary to generate the dedicated power pattern (power pattern having the prescribed frequency) and input the power pattern to the secondary battery in order to calculate the impedance of the secondary battery. Generally, however, a power pattern input to and output from a secondary battery during traveling of a vehicle depends on driver's driving operation (such as an amount of operation of an accelerator pedal and an amount of operation of a brake pedal). Therefore, it is difficult to generate the dedicated power pattern for calculating the impedance of the secondary battery during traveling of the vehicle. Thus, in the method disclosed in Japanese Patent Laying-Open No. 2020-41917, it is difficult to calculate the impedance during traveling of the vehicle.

The present disclosure has been made to solve the above-described problem, and an object of the present disclosure is to make it possible to calculate a resistance deterioration state (impedance) of a battery even from an arbitrary power pattern, without generating a dedicated power pattern.

A state calculating apparatus according to the present disclosure is a state calculating apparatus for a chargeable and dischargeable battery, the state calculating apparatus including: a first measuring unit that measures a current charged to and discharged from the battery; a second measuring unit that measures a voltage of the battery during measurement of the current by the first measuring unit; a first processing unit that extracts a current component, the current component being a component in a prescribed frequency band, of the current measured by the first measuring unit; a second processing unit that extracts a voltage component, the voltage component being a component in the prescribed frequency band, of the voltage measured by the second measuring unit; and a calculating unit that calculates an impedance of the battery using the current component extracted by the first processing unit and the voltage component extracted by the second processing unit.

A state calculating method according to the present disclosure is a state calculating method for a chargeable and dischargeable battery, the method including: measuring a current charged to and discharged from the battery; measuring a voltage of the battery during measurement of the current; extracting a current component, the current component being a component in a prescribed frequency band, of the measured current; extracting a voltage component, the voltage component being a component in the prescribed frequency band, of the measured voltage; and calculating an impedance of the battery using the extracted current component and the extracted voltage component.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 37 is a second diagram showing an example method for calculating a degree of resistance deterioration of a battery.

DESCRIPTION OF THE PREFERRED EMBODIMENTS

Figure 1:
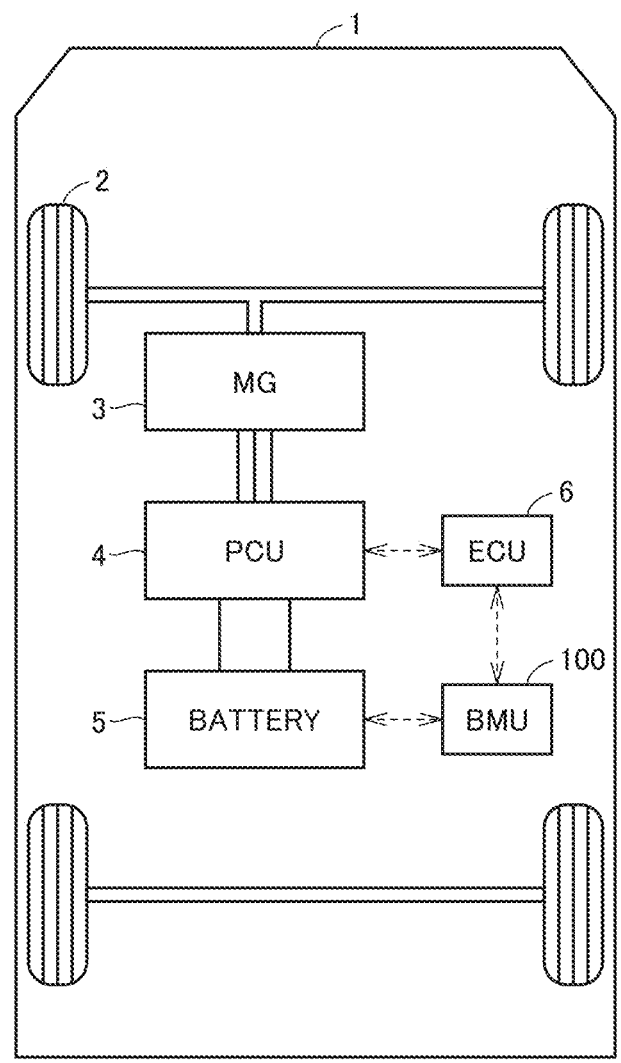
FIG. 1 is a diagram schematically showing an example configuration of a vehicle.

Embodiments of the present disclosure will be described in detail hereinafter with reference to the drawings, in which the same or corresponding portions are denoted by the same reference characters and description thereof will not be repeated.

First Embodiment

FIG. 1 is a diagram schematically showing an example configuration of a vehicle 1 including a state calculating apparatus according to the present embodiment.

Vehicle 1 includes a driving wheel 2, a motor generator 3 mechanically coupled to driving wheel 2, a power control unit (PCU) 4, a battery 5, an electronic control unit (ECU) 6, and a battery management unit (BMU) 100.

Vehicle 1 is an electric powered vehicle that travels using motive power of motor generator 3. Vehicle 1 may include a motive power source (e.g., an engine) other than motor generator 3.

Motor generator 3 is, for example, a three-phase AC rotating electric machine. Motor generator 3 is driven by electric power supplied from battery 5 through PCU 4. Motor generator 3 can also perform regenerative power generation using motive power transmitted from driving wheel 2, and supply the generated electric power to battery 5 through PCU 4.

Battery 5 is configured to include a secondary battery (chargeable and dischargeable battery) such as, for example, a lithium ion battery or a nickel-metal hydride battery. The secondary battery may be a single battery or an assembled battery.

PCU 4 is configured to include an inverter and a boost and step-down converter that operate in accordance with an instruction from ECU 6. In accordance with an instruction from ECU 6, PCU 4 converts the electric power supplied from battery 5 into electric power that can drive motor generator 3, and supplies the electric power to motor generator 3, or converts the electric power generated by motor generator 3 into electric power that can be charged to battery 5, and supplies the electric power to battery 5.

Furthermore, although not shown, vehicle 1 is provided with a plurality of sensors for detecting various physical amounts required to control vehicle 1, such as an amount of operation of an accelerator pedal by a driver, an amount of operation of a brake pedal by a driver, and a vehicle speed. These sensors transmit the detection results to ECU 6.

BMU 100 detects a voltage, a current and a temperature of battery 5. BMU 100 outputs the detection results to ECU 6. As described below, BMU 100 also has the function of calculating an impedance and a degree of resistance deterioration of battery 5.

ECU 6 performs a prescribed computation process based on the information from the sensors and BMU 100 and information stored in a memory, and controls PCU 4 based on the computation result.

Figure 2:
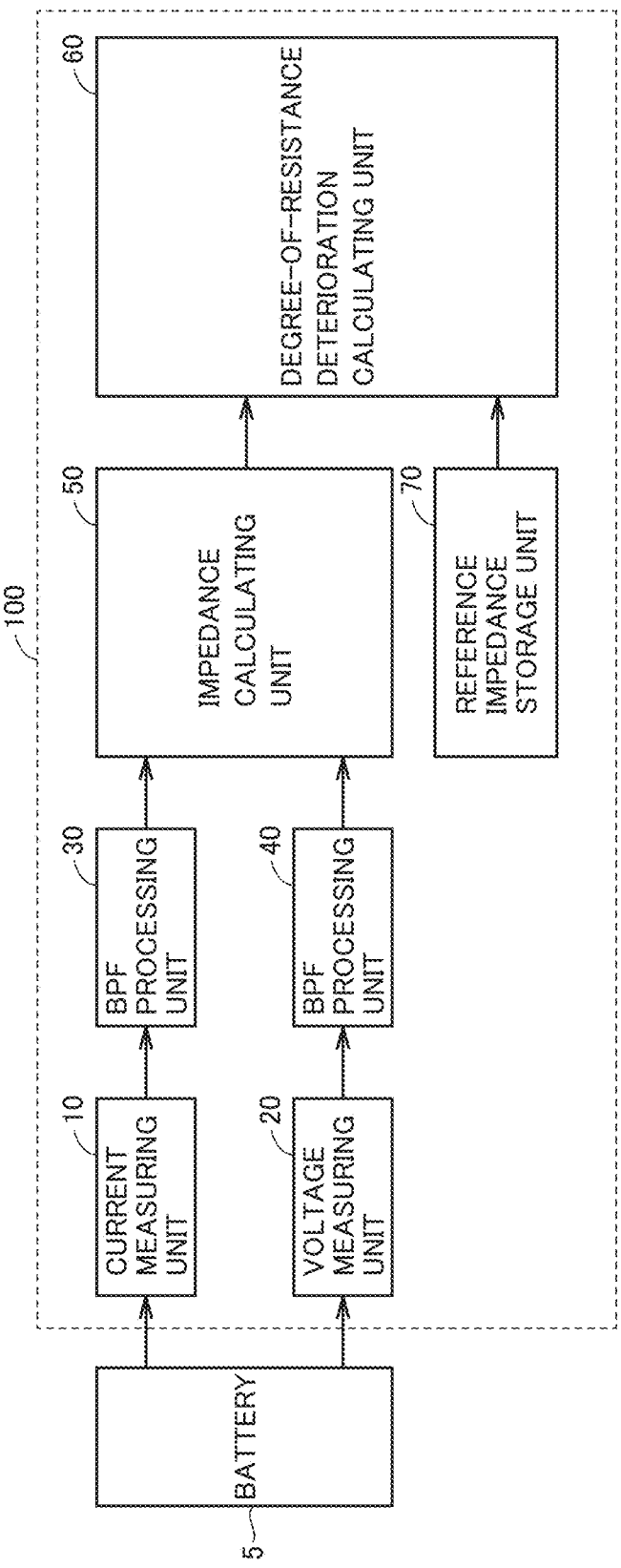
FIG. 2 is a first diagram schematically showing an example configuration of a BMU.

FIG. 2 is a diagram schematically showing an example configuration of BMU 100. BMU 100 includes a current measuring unit 10, a voltage measuring unit 20, BPF (band-pass filter) processing units 30 and 40, an impedance calculating unit 50, a degree-of-resistance deterioration calculating unit 60, and a reference impedance storage unit 70. Current measuring unit 10, voltage measuring unit 20, BPF processing unit 30, BPF processing unit 40, impedance calculating unit 50, degree-of-resistance deterioration calculating unit 60, and reference impedance storage unit 70 correspond to examples of "first measuring unit", "second measuring unit", "first processing unit", "second processing unit", "calculating unit", "estimating unit", and "storage unit" according to the present disclosure, respectively.

Current measuring unit 10 measures a current charged to and discharged from battery 5, and outputs the current to BPF processing unit 30. Voltage measuring unit 20 measures a voltage of battery 5 during measurement of the current by current measuring unit 10.

BPF processing unit 30 extracts a component in a prescribed frequency band, of the current measured by current measuring unit 10, and outputs the component to impedance calculating unit 50. Hereinafter, the current component in the prescribed frequency band extracted by BPF processing unit 30 will also be referred to as "extracted current component" or simply "current component".

BPF processing unit 40 extracts a component in the prescribed frequency band, of the voltage measured by voltage measuring unit 20, and outputs the component to impedance calculating unit 50. Hereinafter, the voltage component in the prescribed frequency band extracted by BPF processing unit 40 will also be referred to as "extracted voltage component" or simply "voltage component".

Impedance calculating unit 50 calculates an impedance of battery 5 using the current component extracted by BPF processing unit 30 and the voltage component extracted by BPF processing unit 40. A method for calculating the impedance will be described in detail below.

Degree-of-resistance deterioration calculating unit 60 calculates (estimates) a degree of resistance deterioration of battery 5 using the impedance calculated by impedance calculating unit 50 and a reference impedance stored in reference impedance storage unit 70. For example, degree-of-resistance deterioration calculating unit 60 calculates, as the degree of resistance deterioration of battery 5, a ratio obtained by dividing the impedance calculated by impedance calculating unit 50 by the reference impedance.

Reference impedance storage unit 70 stores the reference impedance used to calculate the degree of resistance deterioration.

Figure 3:
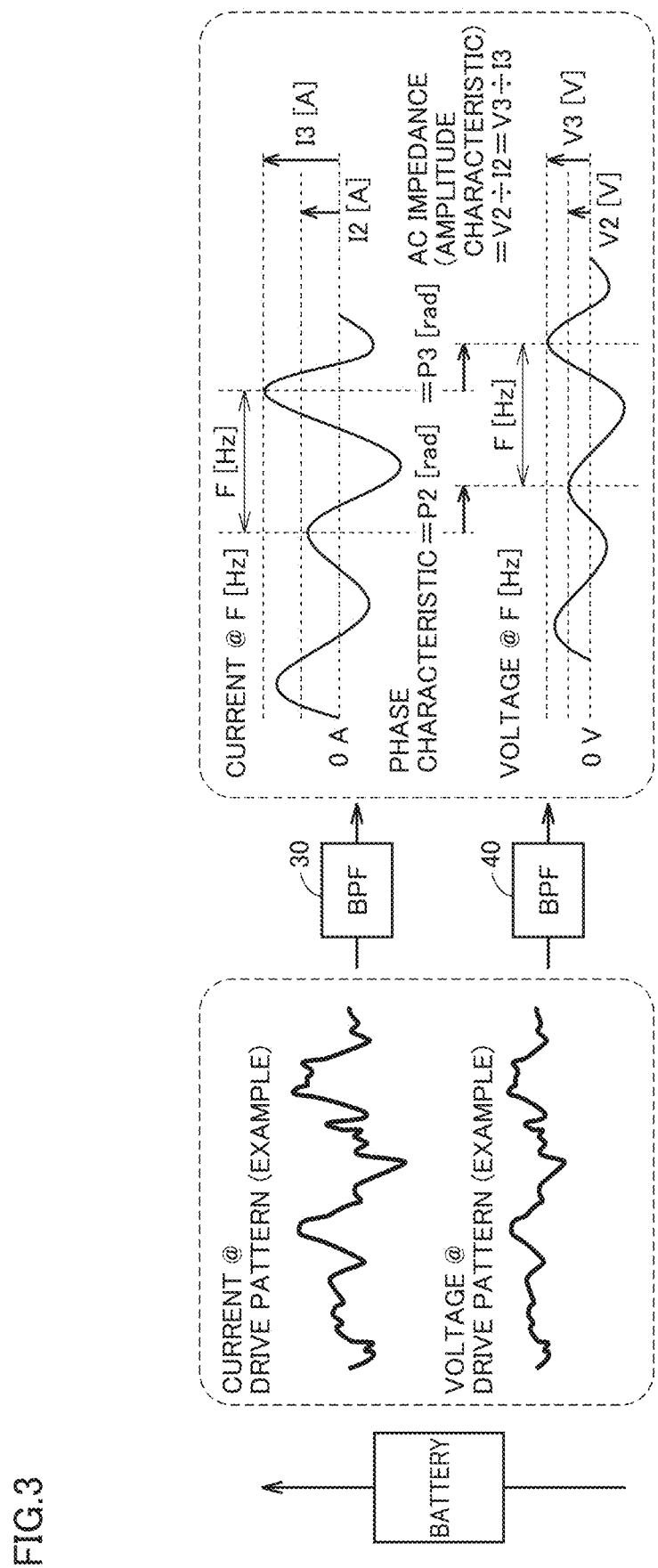
FIG. 3 is a first diagram for illustrating a method for calculating an impedance.

FIG. 3 is a diagram for illustrating the method for calculating the impedance by impedance calculating unit 50.

The component in the prescribed frequency band, of the current measured by current measuring unit 10 is extracted by BPF processing unit 30, and transmitted to impedance calculating unit 50. The component in the prescribed frequency band, of the voltage measured by voltage measuring unit 20 is extracted by BPF processing unit 40, and transmitted to impedance calculating unit 50.

Impedance calculating unit 50 identifies an amplitude of the current component extracted by BPF processing unit 30, and identifies an amplitude of the voltage component extracted by BPF processing unit 40. Then, impedance calculating unit 50 calculates, as the impedance (AC impedance) of battery 5, a value obtained by dividing the amplitude of the voltage component by the amplitude of the current component. More specifically, in view of the fact that there is a phase difference between the current component and the voltage component, impedance calculating unit 50 combines a current amplitude I2 with a voltage amplitude V2 of a phase difference P2 detected next, to thereby calculate "V2/I2" as the AC impedance, for example. Similarly, impedance calculating unit 50 combines a current amplitude I3 with a voltage amplitude V3 of a phase difference P3 detected next, to thereby calculate "V3/I3" as the AC impedance. "V2/I2" and "V3/I3" have substantially the same value.

Figure 4:
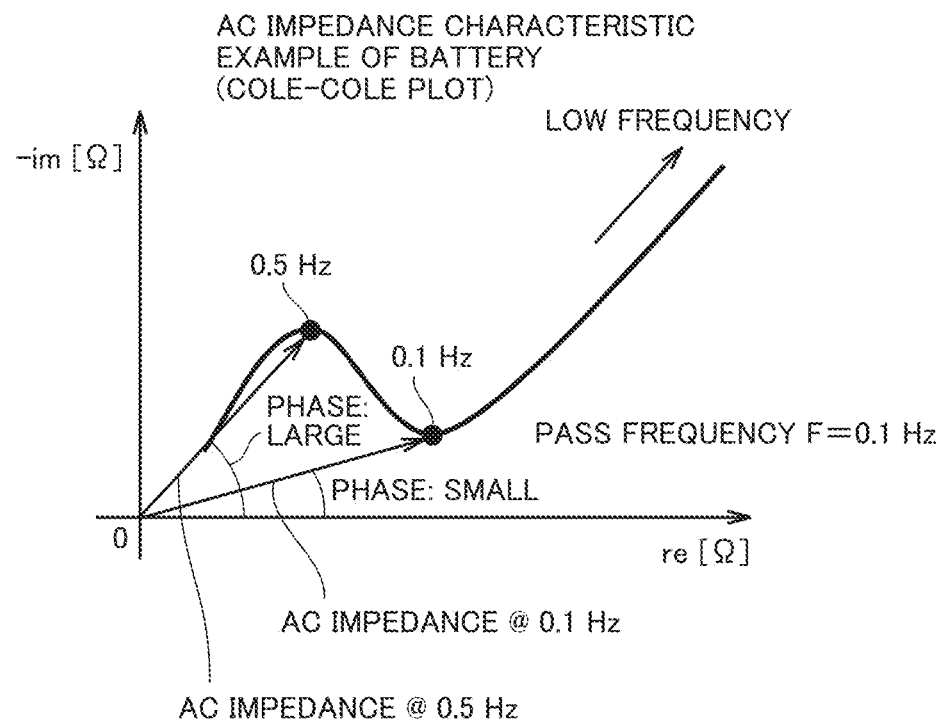
FIG. 4 is a first diagram for illustrating a method for setting a pass frequency band.

FIG. 4 is a diagram for illustrating a method for setting the prescribed frequency band (hereinafter, also referred to as "pass frequency band") extracted by BPF processing units 30 and 40. FIG. 4 schematically shows a waveform of an impedance locus of battery 5 measured using an AC impedance method. In the AC impedance method, a plurality of AC signals having frequencies are sequentially applied to battery 5, and response signals are measured every time the AC signals having the frequencies are applied, and a real component and an imaginary component of an impedance are calculated for each of combinations of the applied AC signals and the measured response signals and plotted on a two-dimensional coordinate (so-called cole-cole plot).

In FIG. 4, the horizontal axis represents the real component (resistance component) of the impedance, and the vertical axis represents the imaginary component (capacitance component) of the impedance. On a complex plane shown in FIG. 4, a distance to the origin represents the magnitude of the impedance, and an angle to the horizontal axis represents a phase difference between a current and a voltage.

In the present embodiment, description will be given of a case in which each signal applied to battery 5 in the AC impedance method is a current and the response signal thereof is a voltage. That is, in the present embodiment, the impedance of battery 5 measured using the AC impedance method is calculated from the relationship between an AC current input to battery 5 and an AC voltage generated when the AC current is input to battery 5. The impedance of battery 5 can also be calculated from the relationship between an AC voltage input to battery 5 and an AC current generated when the AC voltage is input to battery 5.

Generally, when a phase difference between an AC signal applied to battery 5 and a response signal thereof is small, an amount of change in impedance is small (i.e., the impedance can be stably calculated) even if a frequency of the signal applied to battery 5 changes. In view of this point, a center value (hereinafter, also referred to as "pass frequency F") of the pass frequency band is set at a frequency at which a phase difference between the current and the voltage has a local minimum or a value close to the local minimum (value that is slightly larger than the local minimum) in a phase characteristic of battery 5. In the example shown in FIG. 4, when a frequency of the AC current applied to battery 5 is 0.1 Hz, the phase difference has a local minimum (the angle to the horizontal axis is minimum), and thus, pass frequency F is set at "0.1 Hz". A frequency band of a prescribed width centered at pass frequency F is set as the pass frequency band. Thus, the impedance of battery 5 can be stably calculated.

Figure 5:
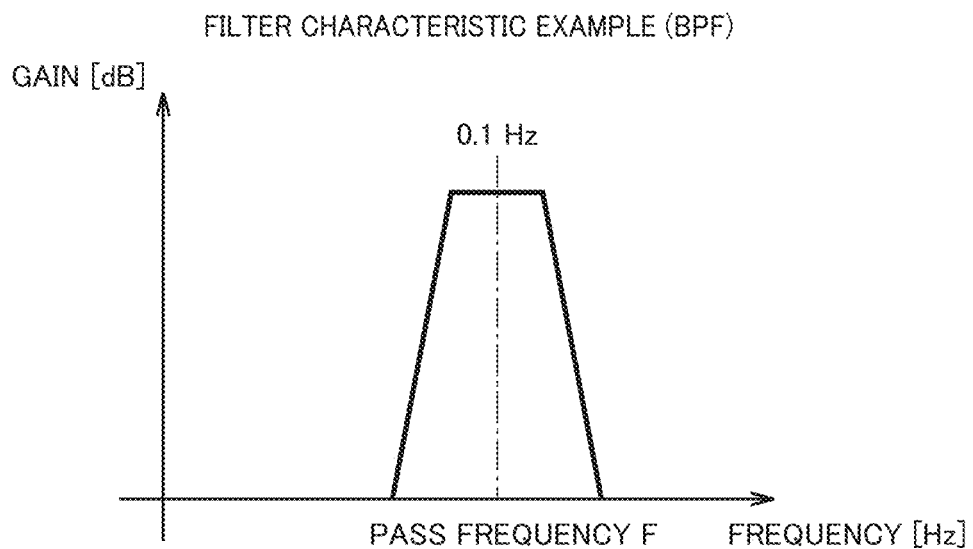
FIG. 5 is a first diagram showing an example filter characteristic of a BPF processing unit.

FIG. 5 is a diagram showing an example filter characteristic of each of BPF processing units 30 and 40 when the pass frequency band centered at pass frequency F of 0.1 Hz is set. In FIG. 5, the horizontal axis represents a frequency (unit: Hz) of a signal input to each of BPF processing units 30 and 40, and the vertical axis represents a gain (unit: dB). As shown in FIG. 5, each of BPF processing units 30 and 40 extracts and outputs a signal in the pass frequency band centered at pass frequency F (0.1 Hz).

In the first embodiment, the frequency (in the example shown in FIG. 4, 0.1 Hz) at which the phase difference has a local minimum is preliminarily obtained as pass frequency F by experiment or the like, and pass frequency F (Hz) is stored in the not-shown memory as information for identifying the pass frequency band. "Information for identifying the pass frequency band" stored in the memory is not necessarily limited to a value of pass frequency F itself, and may be filter coefficients (such as a1, a2, b0, b1, and b2 shown in FIG. 34 below) used in digital processing when each of BPF processing units 30 and 40 is implemented by, for example, digital processing.

Figure 6:
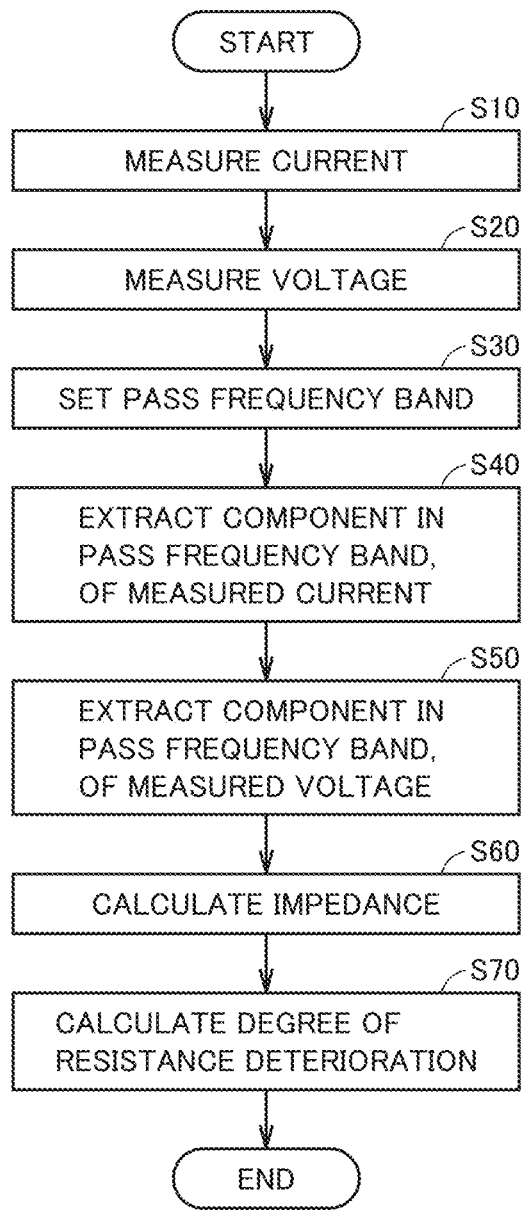
FIG. 6 is a first flowchart showing an example process procedure performed by the BMU.

FIG. 6 is a flowchart showing an example process procedure performed by BMU 100 when calculating the impedance and the degree of resistance deterioration of battery 5. This flowchart can be performed during traveling of vehicle 1.

BMU 100 measures a current charged to and discharged from battery 5 (step S10). BMU 100 measures a voltage of battery 5 during measurement of the current (step S20).

Next, BMU 100 sets a pass frequency band for BPF processing units 30 and 40 (step S30). In the first embodiment, as described above, pass frequency F (in the example shown in FIG. 4, 0.1 Hz) is preliminarily stored in the memory as the information for identifying the pass frequency band. Therefore, in step S30, BMU 100 reads pass frequency F stored in the memory, and sets a pass frequency band of a prescribed width centered at read pass frequency F.

BMU 100 causes BPF processing unit 30 to extract a current component in the pass frequency band, of the measured current (step S40). BMU 100 causes BPF processing unit 40 to extract a voltage component in the pass frequency band, of measured voltage V (step S50).

BMU 100 calculates, as an impedance of battery 5, a value obtained by dividing an amplitude of the extracted voltage component by an amplitude of the extracted current component (step S60).

BMU 100 calculates, as a degree of resistance deterioration of battery 5, a ratio obtained by dividing the impedance calculated in step S60 by a reference impedance stored in reference impedance storage unit 70 (step S70).

As described above, in the present embodiment, bandpass filtering is performed by BPF processing units 30 and 40 on the current and the voltage generated in an arbitrary power pattern during traveling of vehicle 1, to thereby extract the current component and the voltage component in the pass frequency band, and the impedance of battery 5 is calculated using the extracted current component and voltage component.

The impedance of battery 5 calculated from the current component and the voltage component extracted by BPF processing units 30 and 40 can produce a result equivalent to that of the impedance obtained using the method (method in which the dedicated power pattern is input to the battery) described in Japanese Patent Laying-Open No. 2020-41917 (PTL 1) above.

Thus, the impedance of battery 5 can be calculated from an arbitrary power pattern during traveling of vehicle 1, without generating the dedicated power pattern designed only for measurement of the impedance of battery 5.

Second Embodiment

In the above-described first embodiment, the pass frequency band extracted by BPF processing units 30 and 40 is fixed.

In a second embodiment, the pass frequency band extracted by BPF processing units 30 and 40 is changed in accordance with at least one of a temperature, a state of charge (SOC) and a degree of deterioration of battery 5. Since the SOC is a ratio of a current amount of power stored in battery 5 to an amount of power stored in battery 5 in a fully charged state, the SOC is a value corresponding to an amount of power stored in battery 5. Since the remaining configuration and process in the second embodiment are the same as those of the above-described first embodiment, detailed description will not be repeated.

Figure 7:
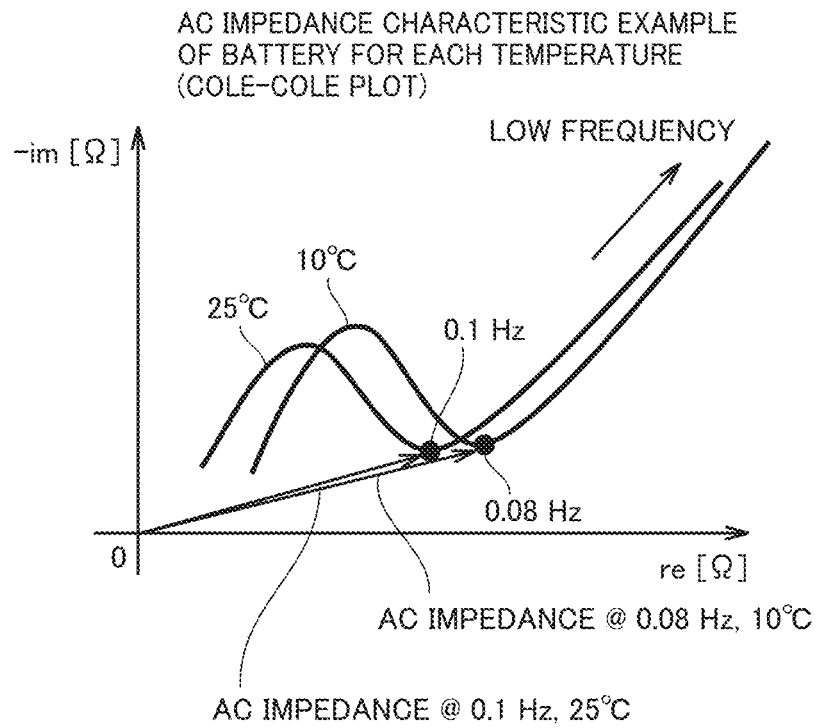
FIG. 7 is a second diagram for illustrating a method for setting a pass frequency band.

FIG. 7 is a diagram for illustrating a method for setting the pass frequency band according to the second embodiment. FIG. 7 shows a waveform of an impedance locus of battery 5 measured using the AC impedance method, for each temperature (in the example shown in FIG. 7, each of 25° C. and 10° C.) of battery 5.

As shown in FIG. 7, the waveform of the impedance locus of battery 5 measured using the AC impedance method varies with temperature of battery 5. Therefore, a frequency at which a phase difference has a local minimum also varies with temperature of battery 5. In the example shown in FIG. 7, the frequency of the current at which the phase difference has a local minimum is 0.1 Hz when the temperature of battery 5 is 25° C., whereas the frequency of the current at which the phase difference has a local minimum is 0.08 Hz when the temperature of battery 5 is 10° C.

In view of this point, in the second embodiment, a correspondence relationship between the temperature of battery 5 and pass frequency F is preliminarily obtained by experiment or the like and stored, and pass frequency F is changed in accordance with the actual temperature of battery 5. Then, the pass frequency band is changed in accordance with pass frequency F.

Figure 8:
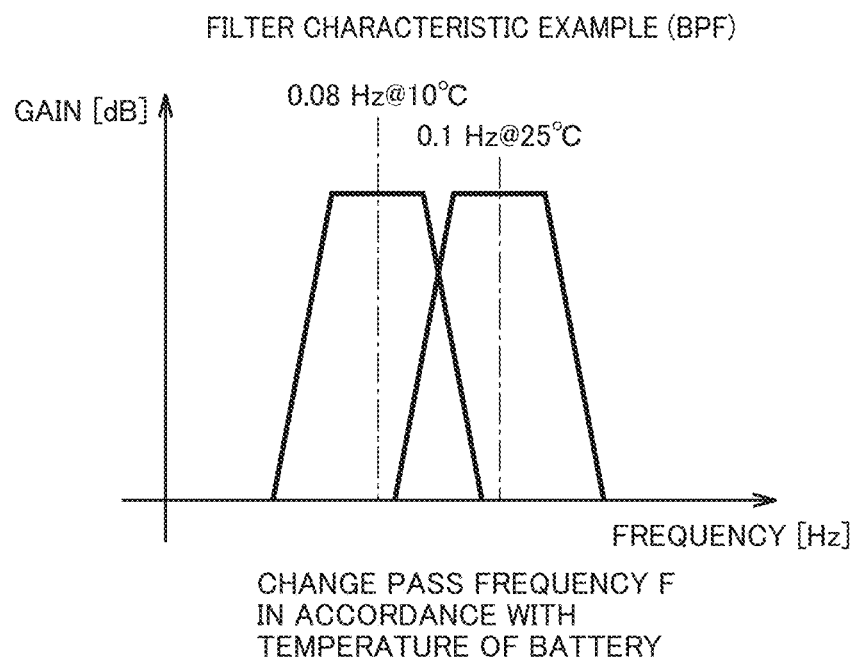
FIG. 8 is a second diagram showing an example filter characteristic of a BPF processing unit.

FIG. 8 is a diagram showing an example filter characteristic of each of BPF processing units 30 and 40 according to the second embodiment. When the temperature of battery 5 is 25° C., pass frequency F is set at 0.1 Hz, and when the temperature of battery 5 is 10° C., pass frequency F is set at 0.08 Hz. Thus, as shown in FIG. 8, when the temperature of battery 5 is 25° C., a signal in a pass frequency band centered at 0.1 Hz is extracted by BPF processing units 30 and 40. When the temperature of battery 5 is 10° C., a signal in a pass frequency band centered at 0.08 Hz is extracted by BPF processing units 30 and 40. As a result, even when the temperature of battery 5 changes, the impedance of battery 5 can be stably calculated.

The waveform of the impedance locus of battery 5 measured using the AC impedance method may also vary not only with the temperature of battery 5 but also with the SOC of battery 5 and the degree of deterioration of battery 5. Therefore, a correspondence relationship between the temperature, SOC and degree of deterioration of battery 5 and pass frequency F may be preliminarily stored, and pass frequency F may be changed in accordance with the actual temperature, SOC and degree of deterioration of battery 5. By increasing the parameters for determining pass frequency F as described above, the impedance of battery 5 can be calculated more stably.

Figure 9:
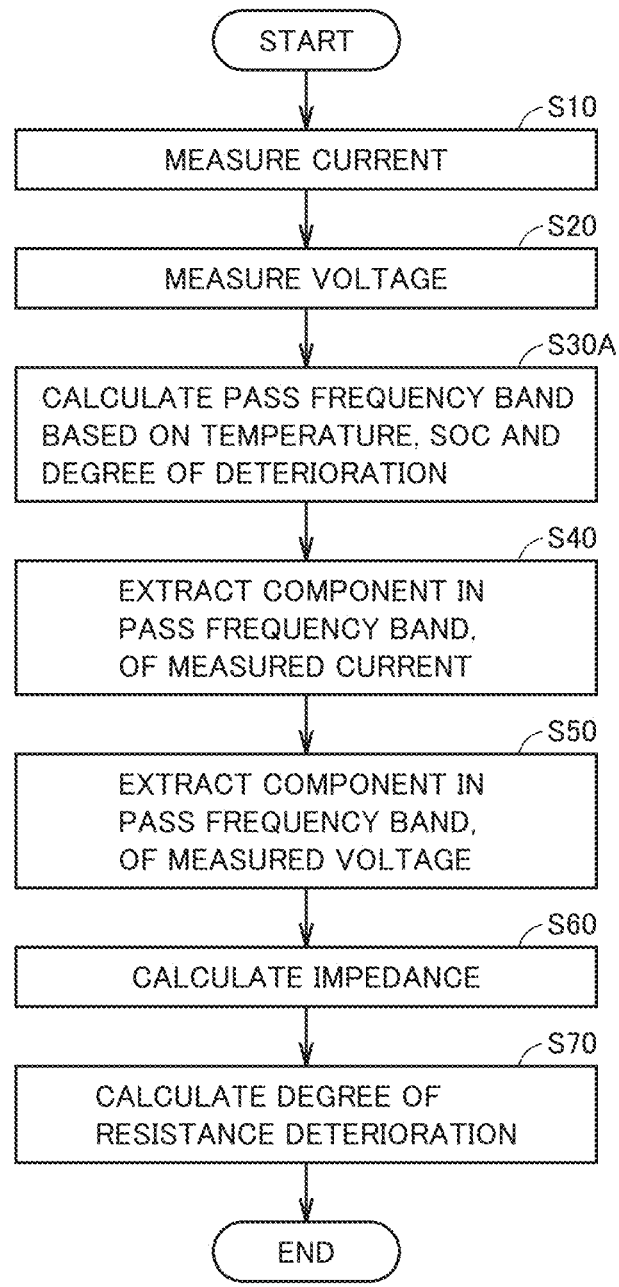
FIG. 9 is a second flowchart showing an example process procedure performed by a BMU.

FIG. 9 is a flowchart showing an example process procedure performed by BMU 100 when calculating the impedance and the degree of resistance deterioration of battery 5 according to the second embodiment. The flowchart shown in FIG. 9 is different from the flowchart shown in FIG. 6 above in that step S30 in the flowchart shown in FIG. 6 above is replaced with step S30A. Since the remaining steps (steps having the same numbers as those of the steps shown in FIG. 6 above) in FIG. 9 have already been described, detailed description will not be repeated.

In step S30A, BMU 100 sets a pass frequency band based on a temperature, SOC and degree of deterioration of battery 5. Specifically, as described above, by referring to the preliminarily stored correspondence relationship between the temperature, SOC and degree of deterioration of battery 5 and pass frequency F, BMU 100 determines pass frequency F corresponding to a current temperature, SOC and degree of deterioration of battery 5, and sets a pass frequency band of a prescribed width centered at determined pass frequency F.

By doing so, the impedance can be calculated with a reduced calculation error with respect to an arbitrary temperature, SOC and degree of deterioration of battery 5.

As described above, the pass frequency band may be changed in accordance with at least one of the temperature, the SOC and the degree of deterioration of battery 5.

Third Embodiment

In the above-described first embodiment, the frequency at which the phase difference has a local minimum is preliminarily obtained from the impedance locus of battery 5 measured using the AC impedance method, and the pass frequency band centered at the obtained frequency is set.

In a third embodiment, the pass frequency band extracted by BPF processing units 30 and 40 is changed, and a frequency band in which the phase difference between the current and the voltage of battery 5 has a local minimum or a value close to the local minimum is searched, and the searched frequency band is set as the pass frequency band. Since the remaining configuration and process in the third embodiment are the same as those of the above-described first embodiment, detailed description will not be repeated.

Figure 10:
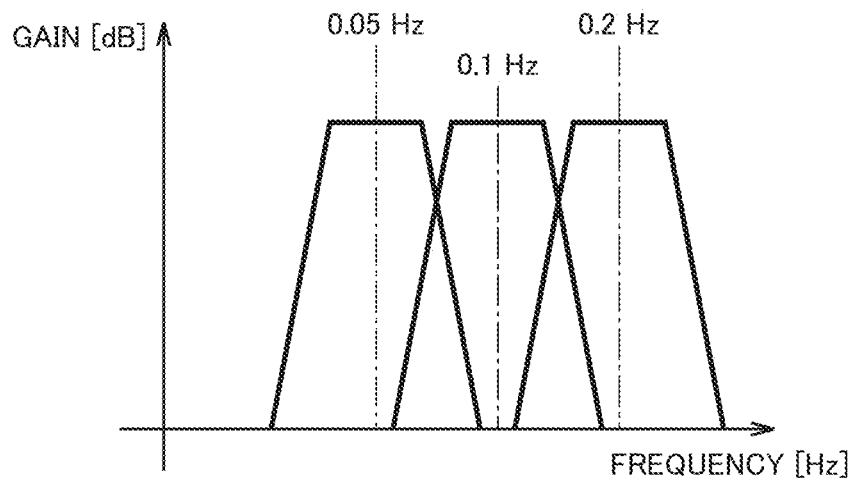
FIG. 10 is a third diagram showing an example filter characteristic of a BPF processing unit.

FIG. 10 is a diagram showing an example filter characteristic of each of BPF processing units 30 and 40 when the pass frequency band is changed. In the third embodiment, the pass frequency band for BPF processing units 30 and 40 is first changed into a plurality of frequency bands that are different from one another. FIG. 10 shows the example in which the pass frequency band is sequentially changed in a time divisional manner into three pass frequency bands centered at pass frequencies F of 0.05 Hz, 0.1 Hz and 0.2 Hz.

Figure 11:
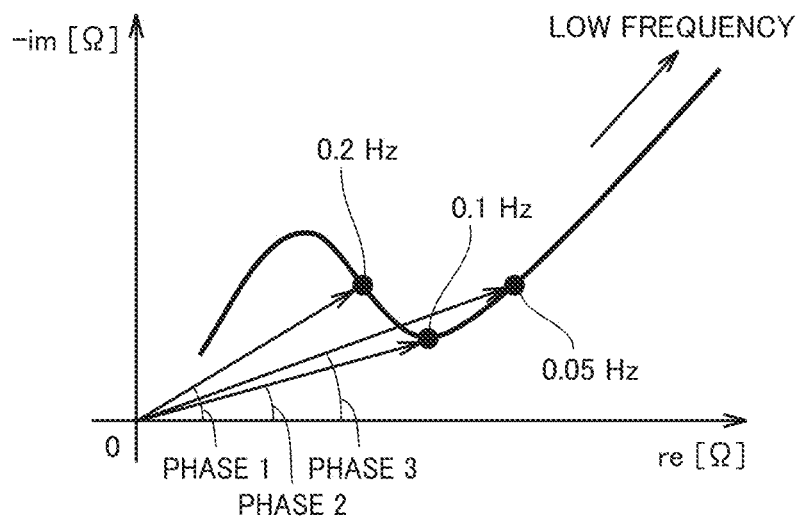
FIG. 11 is a third diagram for illustrating a method for setting a pass frequency band.

FIG. 11 is a diagram for illustrating a method for setting the pass frequency band according to the third embodiment. FIG. 11 shows an example waveform of an impedance locus of battery 5 obtained by changing the pass frequency band. In FIG. 11, when comparison is made among a phase difference in the case of setting the pass frequency band centered at pass frequency F of 0.05 Hz, a phase difference in the case of setting the pass frequency band centered at pass frequency F of 0.1 Hz, and a phase difference in the case of setting the pass frequency band centered at pass frequency F of 0.2 Hz, the phase difference in the case of setting the pass frequency band centered at pass frequency F of 0.1 Hz is the smallest and has a local minimum. In such a case, the frequency band centered at pass frequency F of "0.1 Hz" at which the phase difference is the smallest is selected, and the selected frequency band is set as the pass frequency band used to calculate the impedance.

Figure 12:
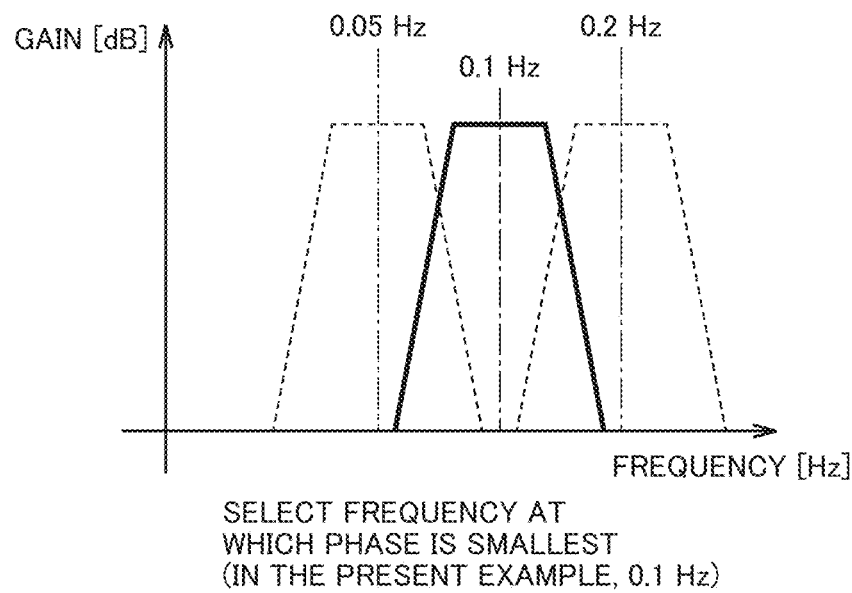
FIG. 12 is a fourth diagram showing an example filter characteristic of the BPF processing unit.

FIG. 12 is a diagram showing an example filter characteristic of each of BPF processing units 30 and 40 when the frequency band centered at pass frequency F of "0.1 Hz" is set as the pass frequency band. When the search result shown in FIG. 11 is obtained, the frequency band centered at pass frequency F of "0.1 Hz" as shown in FIG. 12 is set as the pass frequency band used to calculate the impedance.

Figure 13:
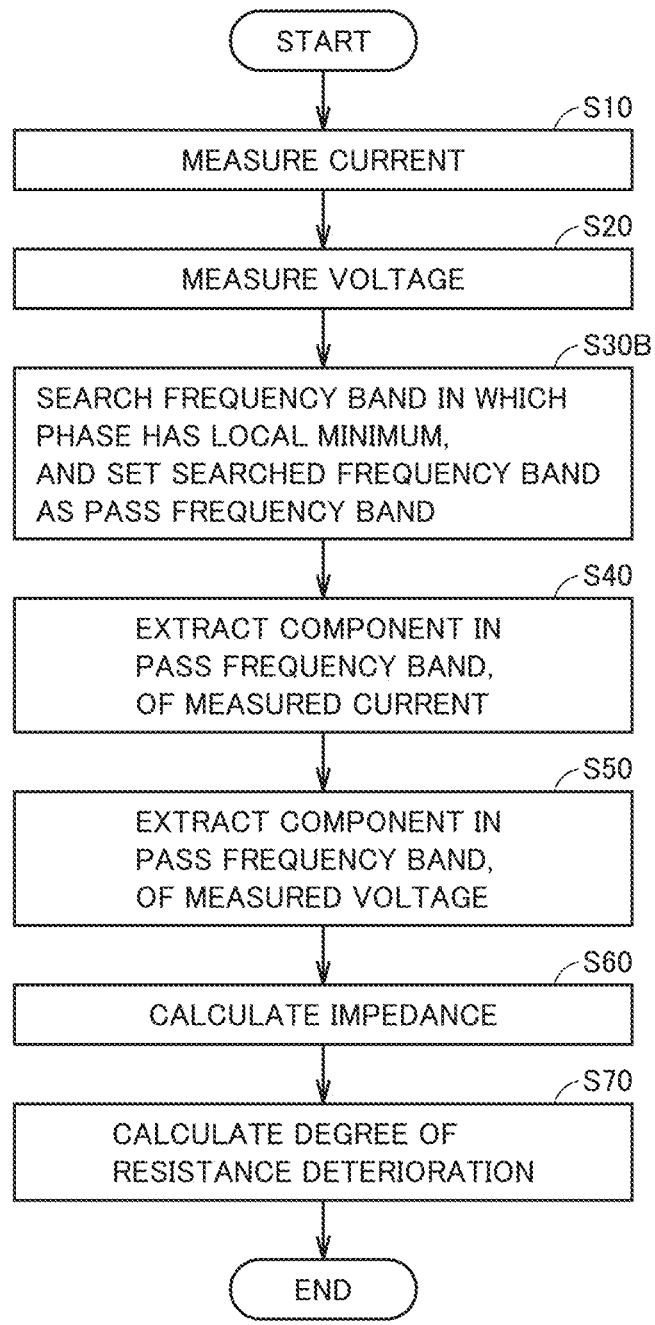
FIG. 13 is a third flowchart showing an example process procedure performed by a BMU.

FIG. 13 is a flowchart showing an example process procedure performed by BMU 100 when calculating the impedance and the degree of resistance deterioration of battery 5 according to the third embodiment. The flowchart shown in FIG. 13 is different from the flowchart shown in FIG. 6 above in that step S30 in the flowchart shown in FIG. 6 above is replaced with step S30B. Since the remaining steps (steps having the same numbers as those of the steps shown in FIG. 6 above) in FIG. 13 have already been described, detailed description will not be repeated.

In step S30B, using the method described with reference to FIGS. 10 to 12 above, BMU 100 searches a frequency band in which a phase difference is the smallest (local minimum), and sets the searched frequency band as a pass frequency band.

By doing so, the pass frequency band suitable for the current state of battery 5 can be set, even when the state (such as the temperature, the SOC and the degree of deterioration) of battery 5 changes. Therefore, the impedance can be calculated with a reduced calculation error.

Fourth Embodiment

Figure 14:
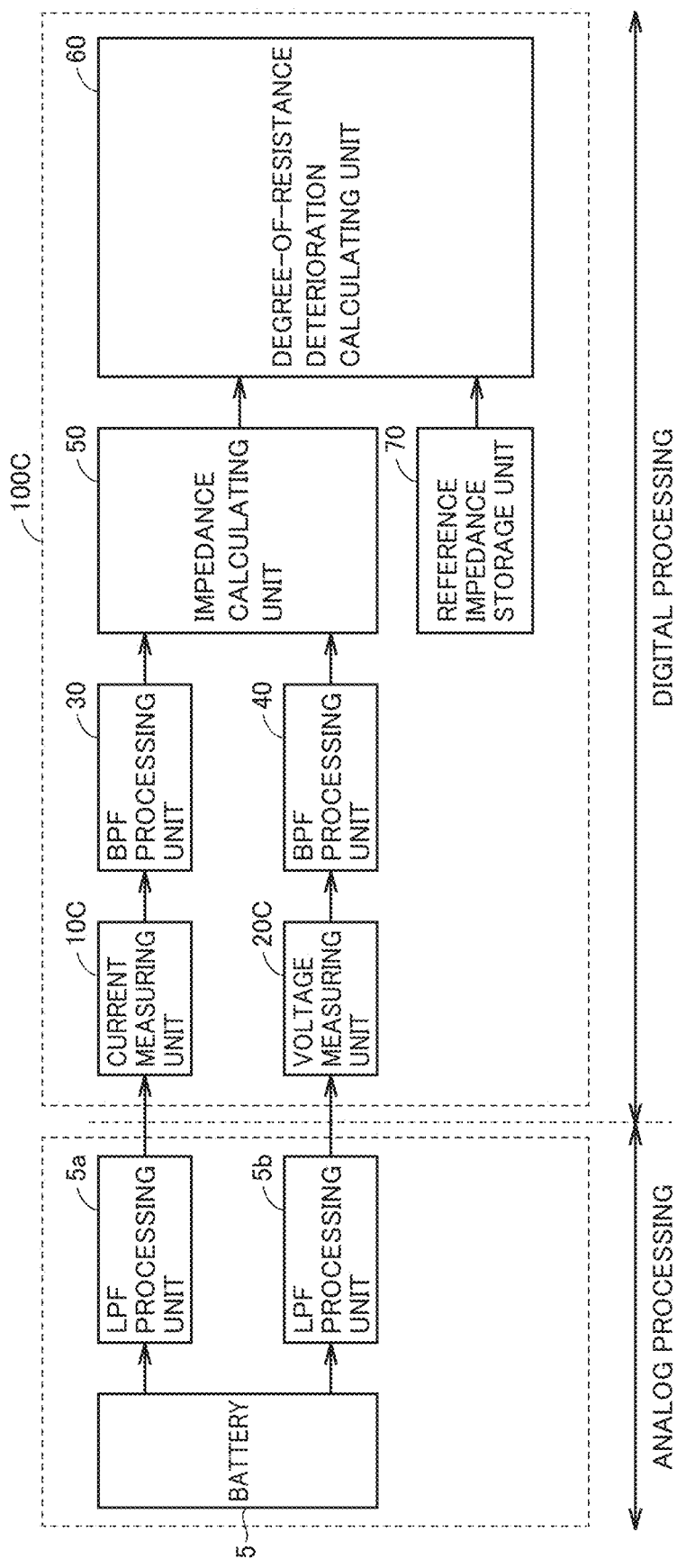
FIG. 14 is a second diagram schematically showing an example configuration of a BMU.

FIG. 14 is a diagram schematically showing an example configuration of a BMU 100C according to a fourth embodiment. BMU 100C is different from BMU 100 shown in FIG. 2 above in that current measuring unit 10 and voltage measuring unit 20 of BMU 100 shown in FIG. 2 above are replaced with a current measuring unit 10C and a voltage measuring unit 20C, respectively. Furthermore, in the fourth embodiment, a low pass filter (LPF) processing unit 5a is provided between battery 5 and current measuring unit 10C, and an LPF processing unit 5b is provided between battery 5 and voltage measuring unit 20C. Since the remaining configuration is the same as the configuration according to the above-described first embodiment, detailed description will not be repeated.

Current measuring unit 10C converts analog data about a current into digital data, and outputs the digital data to BPF processing unit 30. Voltage measuring unit 20C converts analog data about a voltage into digital data, and outputs the digital data to BPF processing unit 40. LPF processing units 5a and 5b are provided to prevent the occurrence of aliasing when current measuring unit 10C and voltage measuring unit 20C convert the analog data into the digital data. In other words, LPF processing units 5a and 5b function as anti-aliasing filters. LPF processing unit 5a and LPF processing unit 5b correspond to examples of "third processing unit" and "fourth processing unit" according to the present disclosure, respectively.

Figure 15:
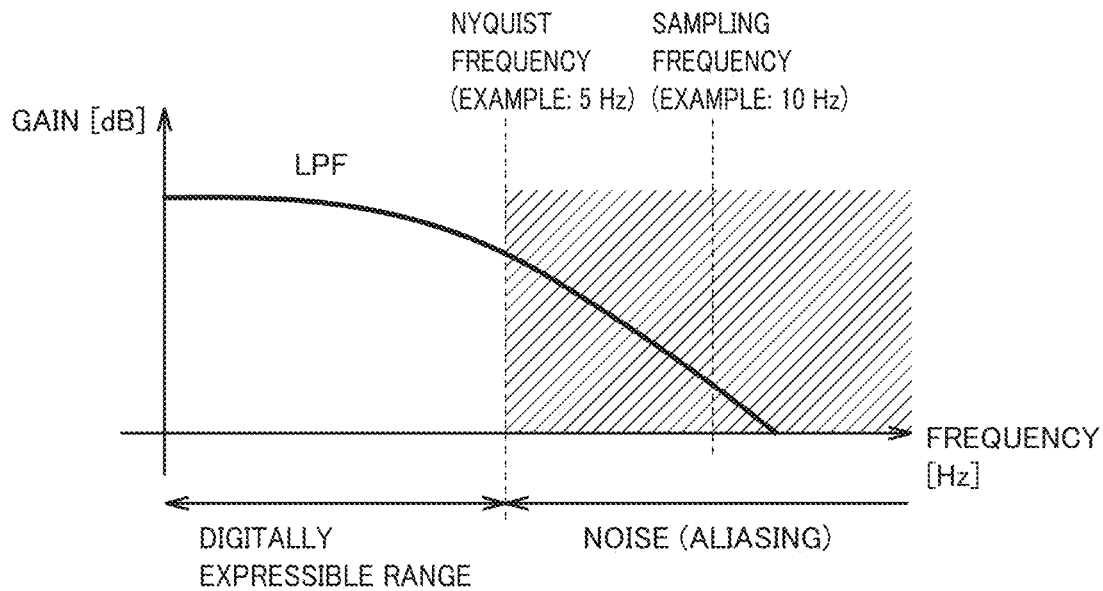
FIG. 15 is a diagram showing an example filter characteristic of an LPF processing unit.

FIG. 15 is a diagram showing an example filter characteristic of each of LPF processing units 5a and 5b. As shown in FIG. 15, when a frequency that is half of a sampling frequency (e.g., 10 Hz) is defined as a Nyquist frequency (e.g., 5 Hz), each of LPF processing units 5a and 5b allows a signal having a frequency smaller than the Nyquist frequency to pass therethrough as a digitally expressible signal, and attenuates a frequency larger than the Nyquist frequency as noise (aliasing).

When such LPF processing units 5a and 5b are provided between battery 5 and measuring units 10C and 20C, it is desirable to determine a pass frequency band in consideration of not only a characteristic of battery 5 alone but also filter characteristics of LPF processing units 5a and 5b.

Figure 16:
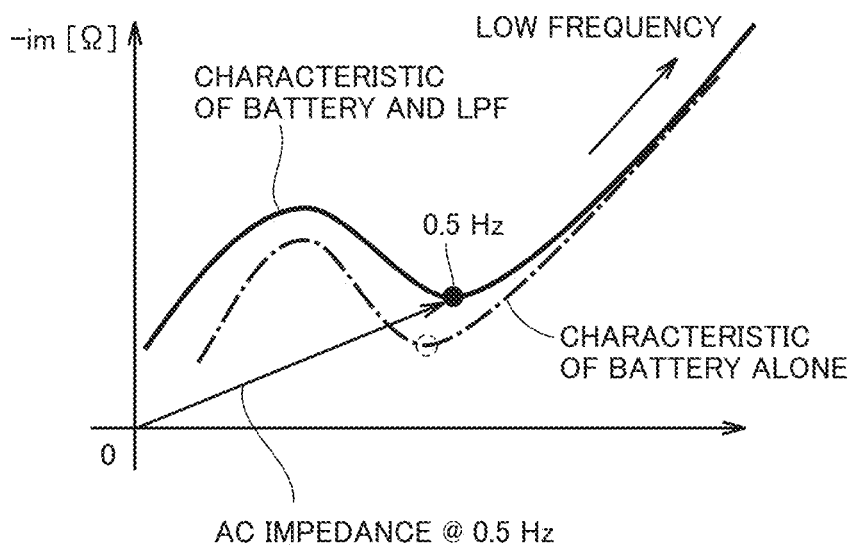
FIG. 16 is a fourth diagram for illustrating a method for setting a pass frequency band.

FIG. 16 is a diagram for illustrating a method for setting the pass frequency band according to the fourth embodiment. FIG. 16 shows a waveform (alternate long and short dash line) of an impedance locus based on the characteristic of battery 5 alone, which is measured using the AC impedance method, and a waveform (solid line) of an impedance locus based on a characteristic of a combination of battery 5 and LPF processing units 5a and 5b.

As shown in FIG. 16, the waveform of the impedance locus based on the characteristic of battery 5 alone and the waveform of the impedance locus based on the characteristic of the combination of battery 5 and LPF processing units 5a and 5b are different from each other. In view of this point, in the fourth embodiment, a frequency at which a phase difference has a local minimum is obtained using the impedance locus based on the characteristic of the combination of battery 5 and LPF processing units 5a and 5b, and the obtained frequency is set as pass frequency F. In the example shown in FIG. 16, the phase difference has a local minimum when the frequency is 0.5 Hz in the impedance locus based on the characteristic of the combination of battery 5 and LPF processing units 5a and 5b, and thus, pass frequency F is set at "0.5 Hz" and a frequency band of a prescribed width centered at "0.5 Hz" is set as the pass frequency band.

Figure 17:
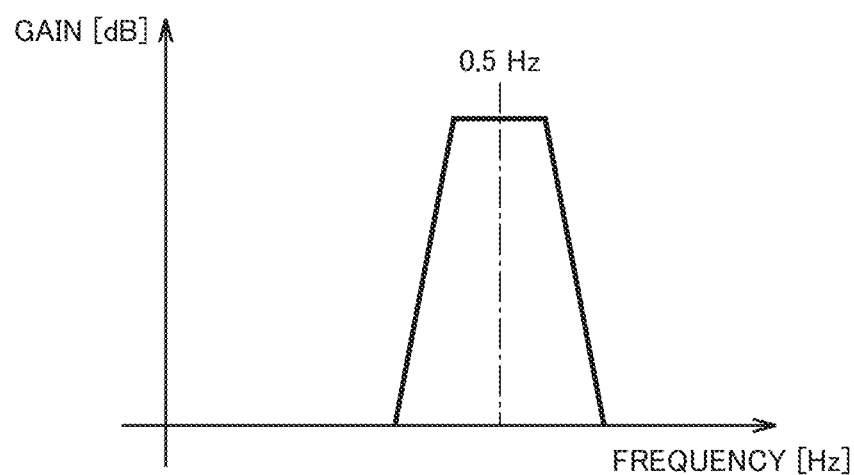
FIG. 17 is a fifth diagram showing an example filter characteristic of a BPF processing unit.

FIG. 17 is a diagram showing an example filter characteristic of each of BPF processing units 30 and 40 according to the fourth embodiment. As shown in FIG. 17, each of BPF processing units 30 and 40 extracts a signal in the pass frequency band centered at "0.5 Hz" that is set as pass frequency F. Thus, the impedance can be calculated with a reduced calculation error, in the system (vehicle 1) including the combination of battery 5 and LPF processing units 5a and 5b, not battery 5 alone.

Fifth Embodiment

Figure 18:
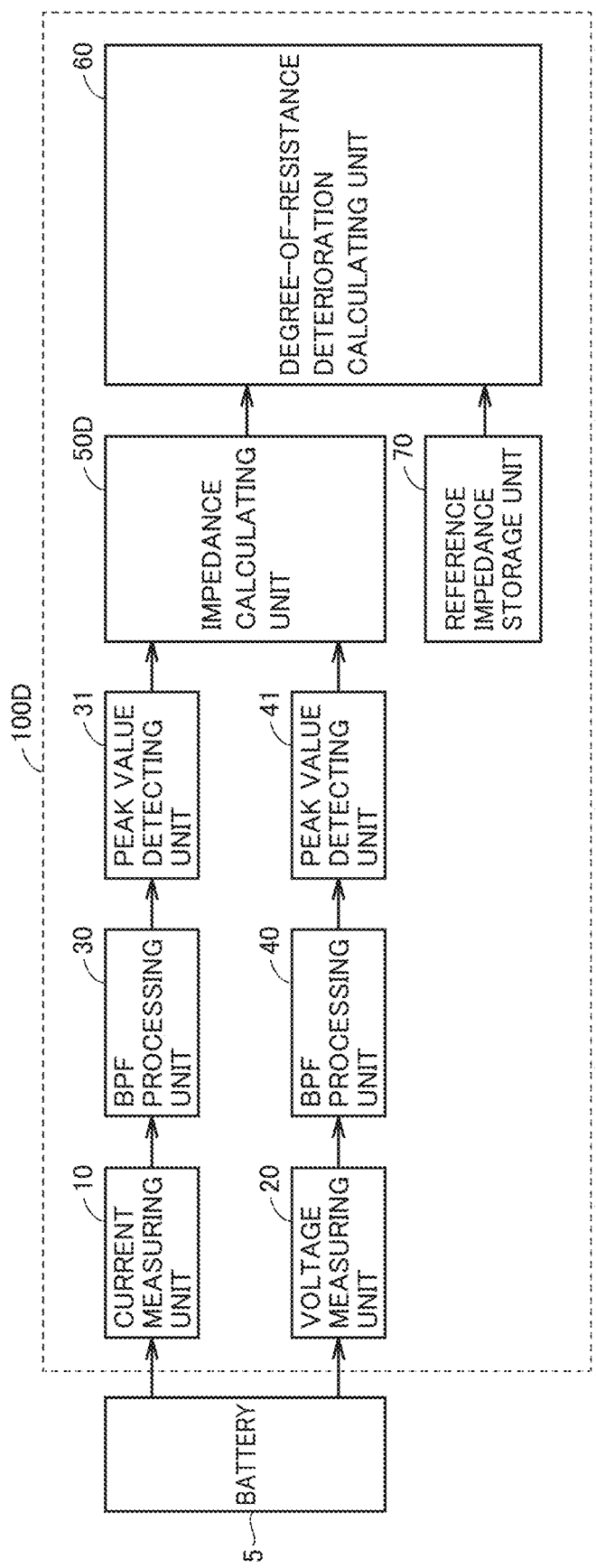
FIG. 18 is a third diagram schematically showing an example configuration of a BMU.

FIG. 18 is a diagram schematically showing an example configuration of a BMU 100D according to a fifth embodiment. BMU 100D is different from BMU 100 shown in FIG. 2 above in that peak value detecting units 31 and 41 are added and impedance calculating unit 50 of BMU 100 is replaced with an impedance calculating unit 50D. Since the remaining configuration of BMU 100D is the same as the configuration of BMU 100 shown in FIG. 2 above, detailed description will not be repeated.

Peak value detecting unit 31 is provided between BPF processing unit 30 and impedance calculating unit 50D, to detect, as current peak values, at least one of local maximum values and local minimum values of the current component extracted by BPF processing unit 30. Peak value detecting unit 31 outputs the detected current peak values to impedance calculating unit 50D.

Peak value detecting unit 41 is provided between BPF processing unit 40 and impedance calculating unit 50D, to detect, as voltage peak values, at least one of local maximum values and local minimum values of the voltage component extracted by BPF processing unit 40. Peak value detecting unit 41 outputs the detected voltage peak values to impedance calculating unit 50D.

Peak value detecting unit 31 and peak value detecting unit 41 correspond to examples of "first detecting unit" and "second detecting unit" according to the present disclosure, respectively.

Impedance calculating unit 50D calculates the impedance using one of the current peak values and a corresponding one of the voltage peak values.

Figure 19:
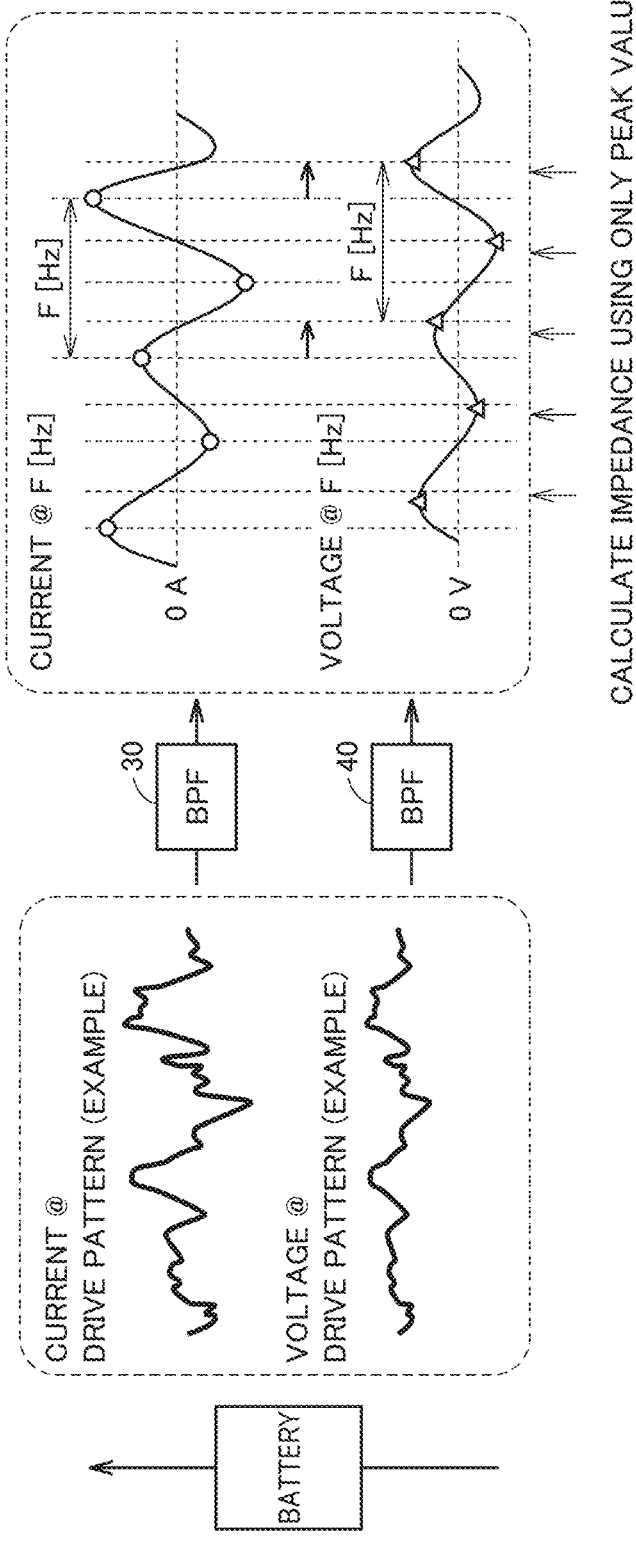
FIG. 19 is a second diagram for illustrating a method for calculating an impedance.

FIG. 19 is a diagram for illustrating a method for calculating the impedance by impedance calculating unit 50D. FIG. 19 shows the example in which the local maximum values and the local minimum values of the current component extracted by BPF processing unit 30 are both detected as the current peak values by peak value detecting unit 31, and the local maximum values and the local minimum values of the voltage component extracted by BPF processing unit 40 are both detected as the voltage peak values by peak value detecting unit 41.

When the current peak values are the local maximum values of the current component, impedance calculating unit 50D calculates the impedance using a combination of one of the local maximum values of the current component and a corresponding one of the local maximum values of the voltage component detected next. When the current peak values are the local minimum values of the current component, impedance calculating unit 50D calculates the impedance using a combination of one of the local minimum values of the current component and a corresponding one of the local minimum values of the voltage component detected next.

With such a configuration, impedance calculating unit 50D can accurately obtain an amplitude (current peak value) of the extracted current component and an amplitude (voltage peak value) of the extracted voltage component. Then, impedance calculating unit 50 calculates the impedance using the obtained current peak value and voltage peak value. Therefore, an impedance calculation error can be reduced.

Figure 20:
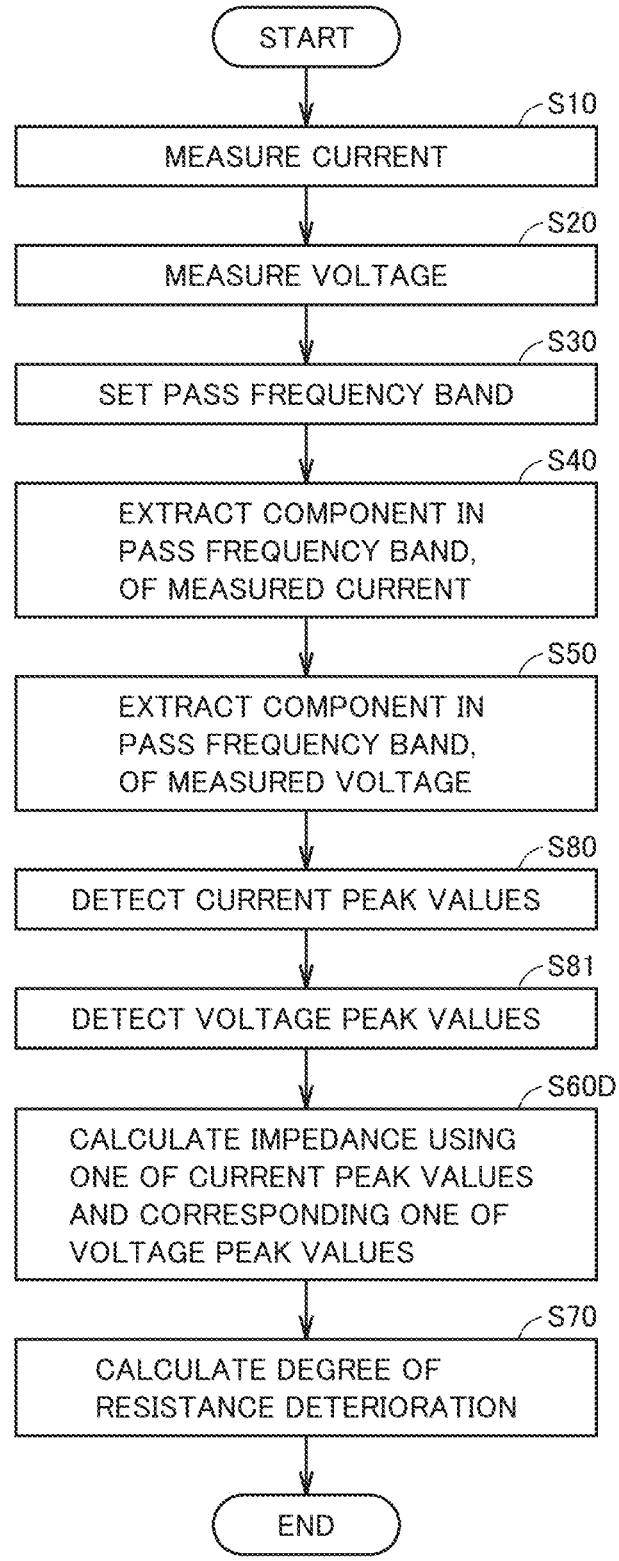
FIG. 20 is a fourth flowchart showing an example process procedure performed by the BMU.

FIG. 20 is a flowchart showing an example process procedure performed by BMU 100D when calculating the impedance and the degree of resistance deterioration of battery 5 according to the fifth embodiment. The flowchart shown in FIG. 20 is different from the flowchart shown in FIG. 6 above in that step S60 in the flowchart shown in FIG. 6 above is replaced with step S60D, and further, steps S80 and S81 are added. Since the remaining steps (steps having the same numbers as those of the steps shown in FIG. 6 above) in FIG. 20 have already been described, detailed description will not be repeated.

In step S80, BMU 100D detects, as current peak values, at least one of local maximum values and local minimum values of the current component extracted in step S40.

In step S81, BMU 100D detects, as voltage peak values, at least one of local maximum values and local minimum values of the voltage component extracted in step S50.

In step S60D, BMU 100D calculates the impedance using one of the current peak values detected in step S80 and a corresponding one of the voltage peak values detected in step S81. Since the specific method for calculating the impedance has been described with reference to FIG. 19 above, detailed description will not be repeated.

With the above-described configuration, the impedance can be calculated with a reduced error.

Sixth Embodiment

Figure 21:
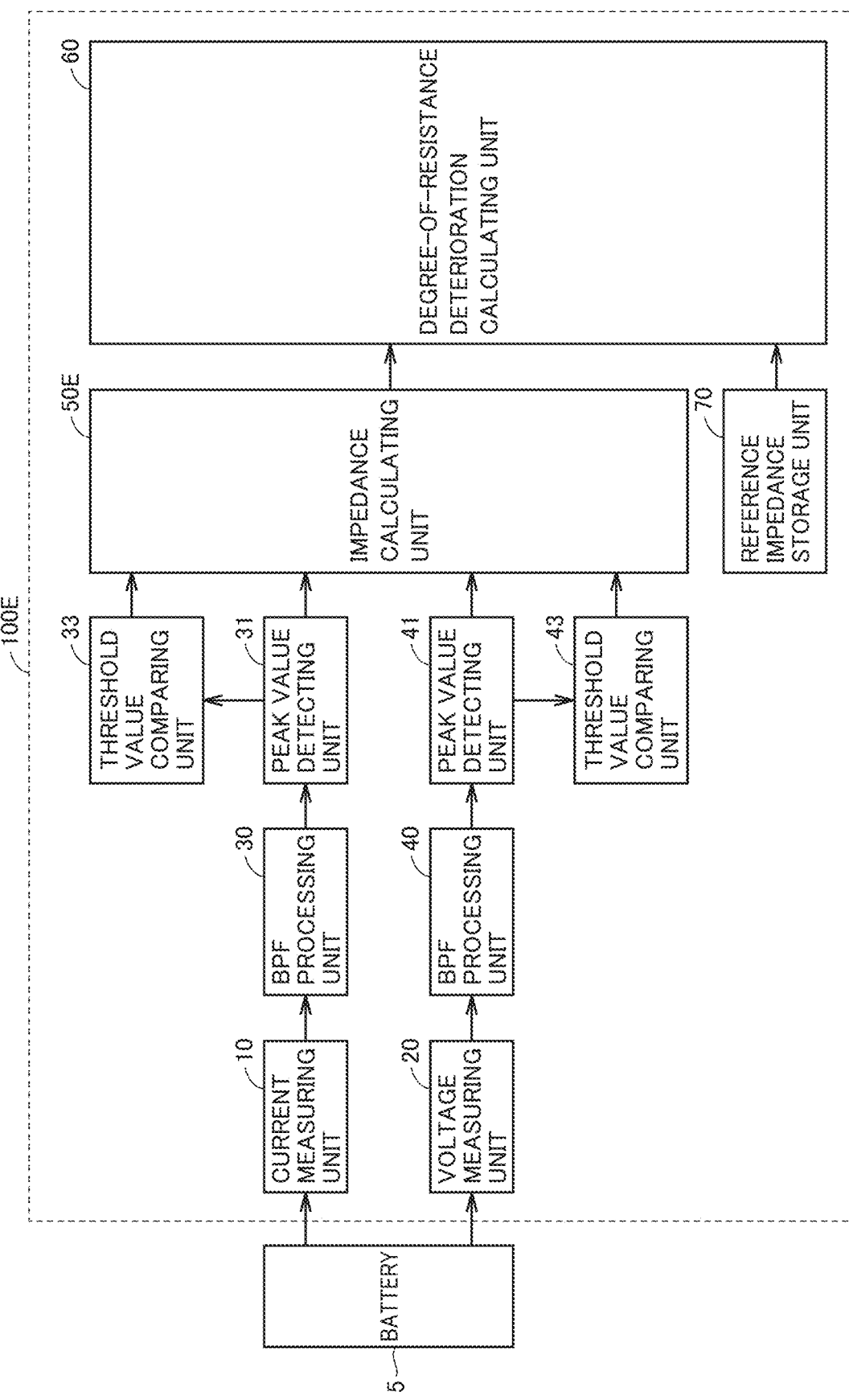
FIG. 21 is a fourth diagram schematically showing an example configuration of a BMU.

FIG. 21 is a diagram schematically showing an example configuration of a BMU 100E according to a sixth embodiment. BMU 100E is different from BMU 100D shown in FIG. 18 above in that threshold value comparing units 33 and 43 are added and impedance calculating unit 50D of BMU 100D is replaced with an impedance calculating unit 50E. Since the remaining configuration of BMU 100E is the same as the configuration of BMU 100D shown in FIG. 18 above, detailed description will not be repeated.

Threshold value comparing unit 33 compares the magnitude (absolute value) of each of the current peak values detected by peak value detecting unit 31 with a current threshold value Ith, and outputs the comparison result to impedance calculating unit 50E.

Threshold value comparing unit 43 compares the magnitude (absolute value) of each of the voltage peak values detected by peak value detecting unit 41 with a voltage threshold value Vth, and outputs the comparison result to impedance calculating unit 50E.

When the magnitude of the current peak value is larger than current threshold value Ith and the magnitude of the voltage peak value is larger than voltage threshold value Vth, impedance calculating unit 50E calculates the impedance using this current peak value and this voltage peak value.

Figure 22:
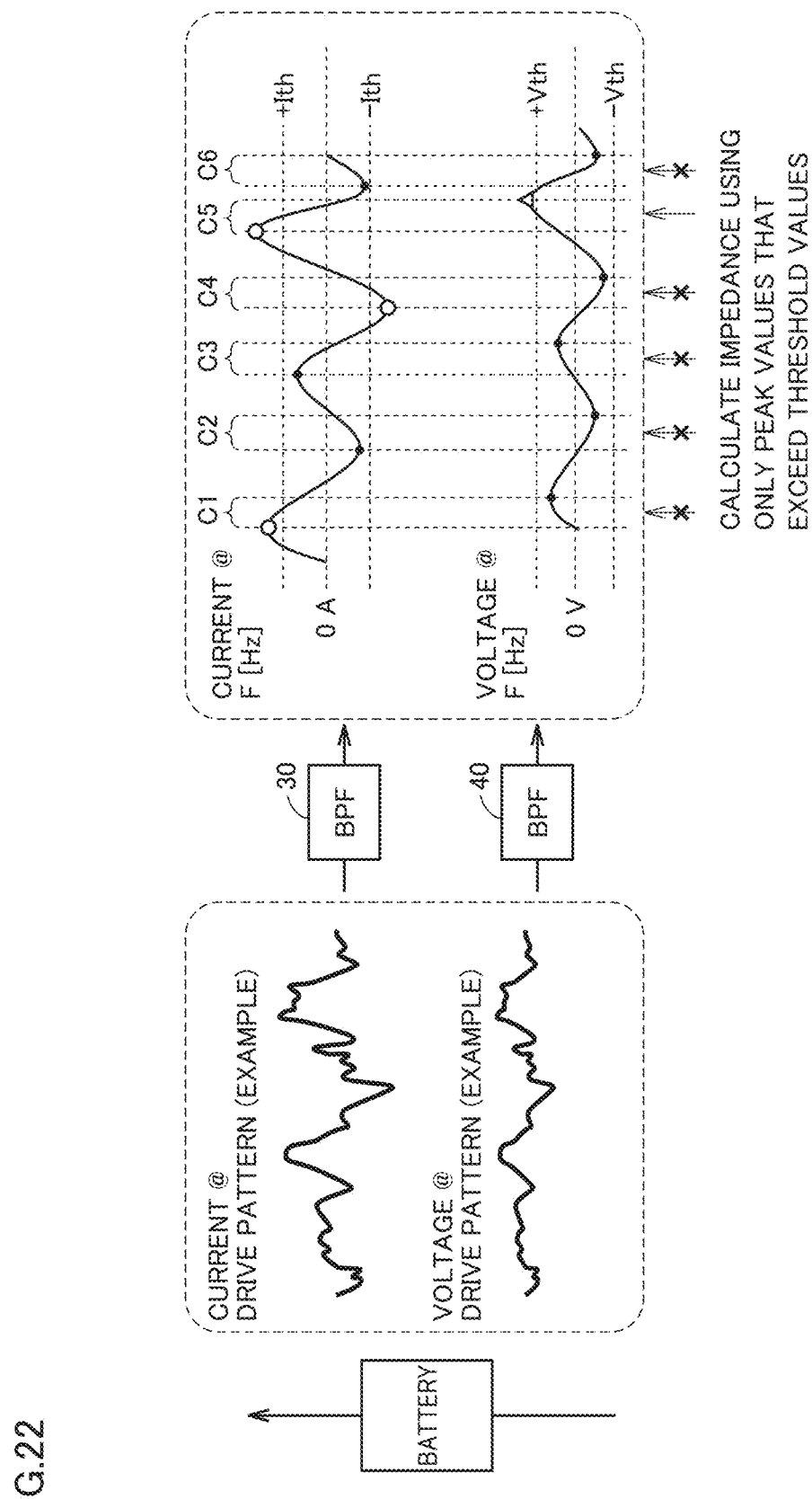
FIG. 22 is a third diagram for illustrating a method for calculating an impedance.

FIG. 22 is a diagram for illustrating a method for calculating the impedance by impedance calculating unit 50E. FIG. 22 shows, by way of example, six combinations C1 to C6 as candidates of combinations of the voltage peak values and the current peak values used to calculate the impedance.

Of six combinations C1 to C6, in combinations C1 to C4 and C6, the magnitude of the current peak value is less than current threshold value Ith or the magnitude of the voltage peak value is less than voltage threshold value Vth. When the impedance is calculated using such combinations C1 to C4 and C6 each having a small amplitude, the impedance is susceptible to noise, which raises concerns that the accuracy of calculation of the impedance decreases.

In contrast, in combination C5, the magnitude of the current peak value is larger than current threshold value Ith and the magnitude of the voltage peak value is larger than voltage threshold value Vth. When the impedance is calculated using such combination C5 having a large amplitude, the impedance is less susceptible to noise, which makes it possible to accurately calculate the impedance.

In view of this point, impedance calculating unit 50E calculates the impedance using combination C5 of the current peak value whose magnitude exceeds current threshold value Ith and the voltage peak value whose magnitude exceeds voltage threshold value Vth.

Figure 23:
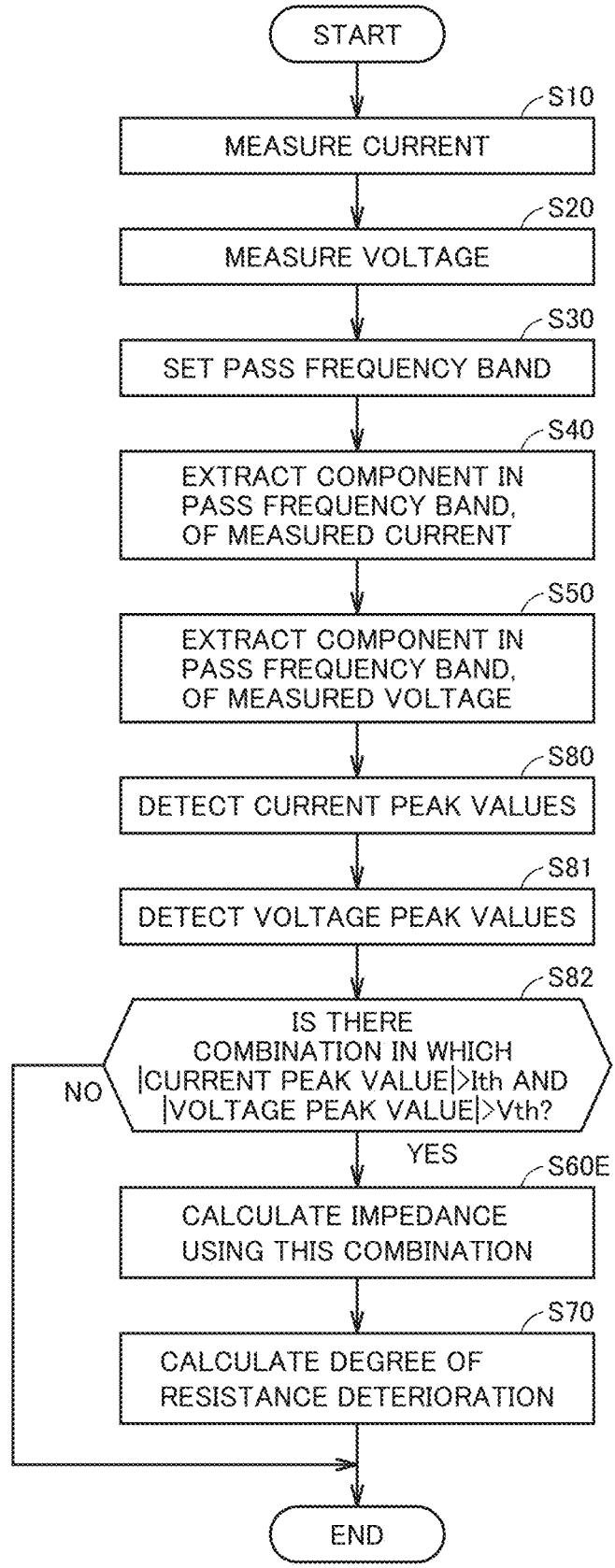
FIG. 23 is a fifth flowchart showing an example process procedure performed by the BMU.

FIG. 23 is a flowchart showing an example process procedure performed by BMU 100E when calculating the impedance and the degree of resistance deterioration of battery 5 according to the sixth embodiment. The flowchart shown in FIG. 23 is different from the flowchart shown in FIG. 20 above in that step S60D in the flowchart shown in FIG. 20 above is replaced with step S60E, and further, step S82 is added. Since the remaining steps (steps having the same numbers as those of the steps shown in FIG. 20 above) in FIG. 23 have already been described, detailed description will not be repeated.

In step S82, BMU 100E determines whether or not there is a combination in which the magnitude of the current peak value is larger than current threshold value Ith and the magnitude of the voltage peak value is larger than voltage threshold value Vth, among the combinations of the current peak values and the voltage peak values detected in steps S80 and S81.

When there is a combination in which the magnitude of the current peak value is larger than current threshold value Ith and the magnitude of the voltage peak value is larger than voltage threshold value Vth (YES in step S82), BMU 100E calculates the impedance using this combination (step S60E).

In contrast, when there is no combination in which the magnitude of the current peak value is larger than current threshold value Ith and the magnitude of the voltage peak value is larger than voltage threshold value Vth (NO in step S82), BMU 100E ends the process without performing the subsequent steps (calculation of the impedance and the degree of resistance deterioration).

With the above-described configuration, the impedance that is less susceptible to noise can be calculated.

Seventh Embodiment

Figure 24:
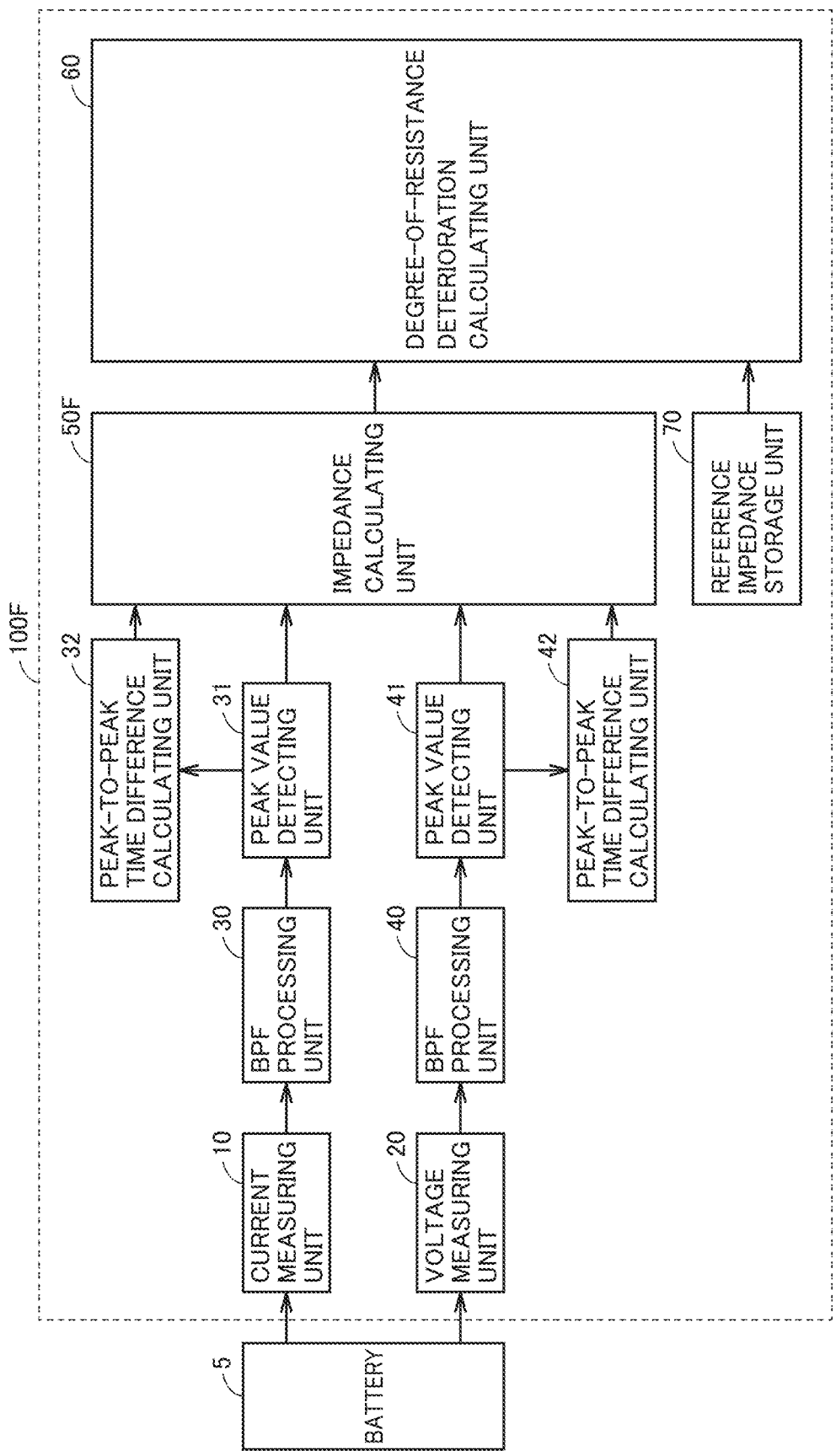
FIG. 24 is a fifth diagram schematically showing an example configuration of a BMU.

FIG. 24 is a diagram schematically showing an example configuration of a BMU 100F according to a seventh embodiment. BMU 100F is different from BMU 100D shown in FIG. 18 above in that peak-to-peak time difference calculating units 32 and 42 are added and impedance calculating unit 50D of BMU 100D is replaced with an impedance calculating unit 50F. Since the remaining configuration of BMU 100F is the same as the configuration of BMU 100D shown in FIG. 18 above, detailed description will not be repeated.

Peak-to-peak time difference calculating unit 32 calculates a time period from detection of a previous value of the current peak value to detection of a present value of the current peak value (hereinafter, also referred to as "current peak-to-peak time difference"), and outputs the calculation result to impedance calculating unit 50F.

Peak-to-peak time difference calculating unit 42 calculates a time period from detection of a previous value of the voltage peak value to detection of a present value of the voltage peak value (hereinafter, also referred to as "voltage peak-to-peak time difference"), and outputs the calculation result to impedance calculating unit 50F.

When the current peak-to-peak time difference is included within a prescribed range R1 and the voltage peak-to-peak time difference is included within a prescribed range R2, impedance calculating unit 50F calculates the impedance using a combination of the present value of the current peak value and the present value of the voltage peak value. Although prescribed range R1 and prescribed range R2 are assumed to have the same value, prescribed range R1 and prescribed range R2 may have different values.

Figure 25:
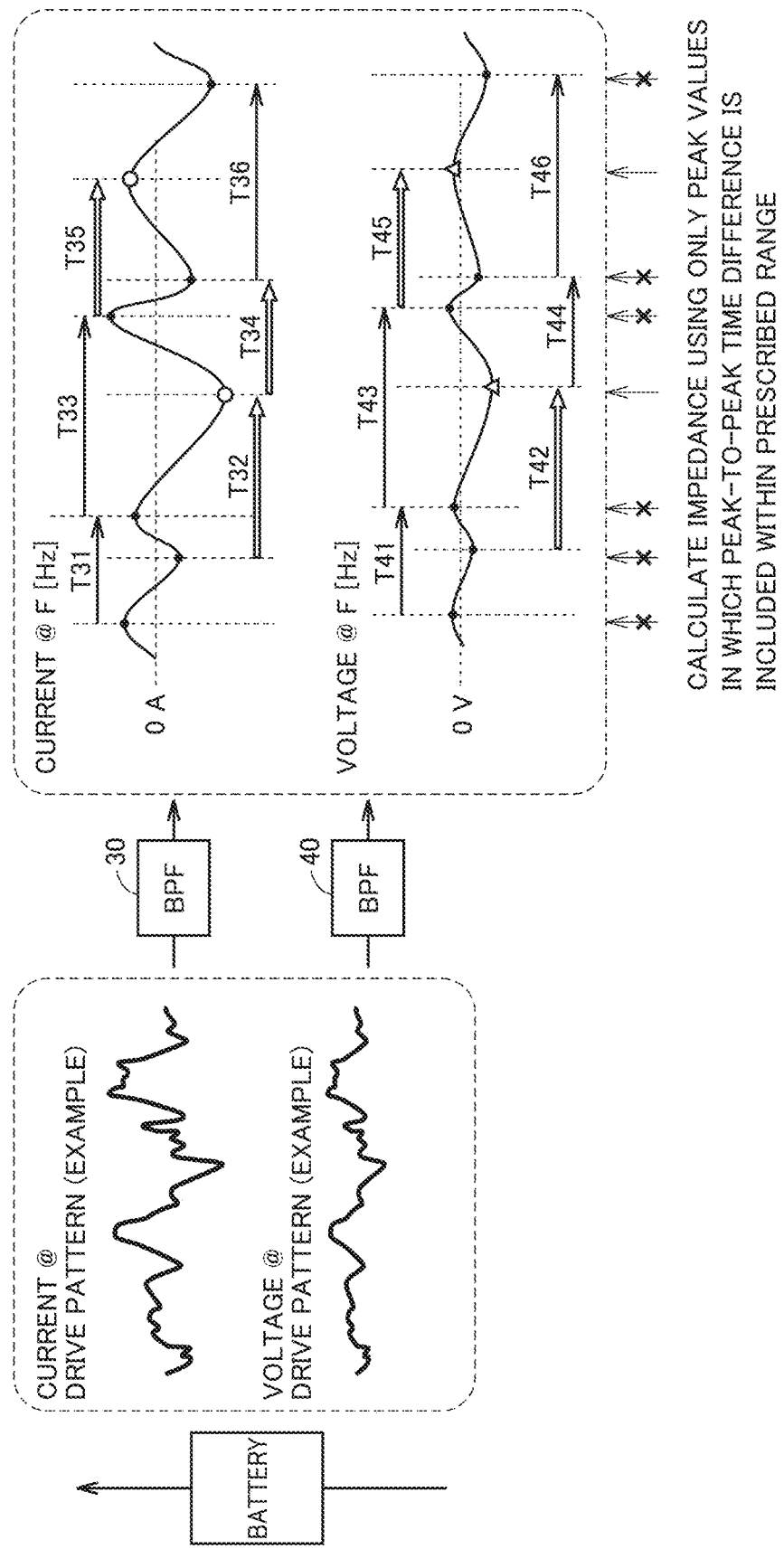
FIG. 25 is a fourth diagram for illustrating a method for calculating an impedance.

FIG. 25 is a diagram for illustrating a method for calculating the impedance by impedance calculating unit 50F. FIG. 25 shows the example in which six current peak-to-peak time differences T31 to T36 (time differences T31, T33 and T35 between local maximum values, and time differences T32, T34 and T36 between local minimum values) are calculated, and six voltage peak-to-peak time differences T41 to T46 (time differences T41, T43 and T45 between local maximum values, and time differences T42, T44 and T46 between local minimum values) are calculated.

In order to reduce an impedance calculation error, it is desirable to calculate the impedance in a state where the outputs of BPF processing units 30 and 40 are stable. In view of this point, when the current peak-to-peak time difference is included within prescribed range R1 and the voltage peak-to-peak time difference is included within prescribed range R2, impedance calculating unit 50F determines that the outputs of BPF processing units 30 and 40 are stable, and calculates the impedance.

Figure 26:
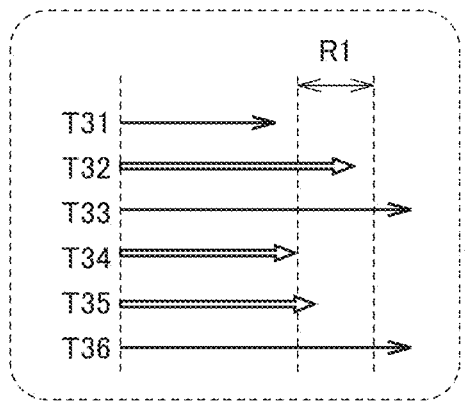
FIG. 26 shows comparison between six current peak-to-peak time differences T31 to T36 shown in FIG. 25 and a prescribed range R1.

FIG. 26 shows comparison between six current peak-to-peak time differences T31 to T36 shown in FIG. 25 and prescribed range R1. Of six current peak-to-peak time differences T31 to T36, time differences T32, T34 and T35 are included within prescribed range R1, whereas the other time differences are not included within prescribed range R1. In this case, it is assumed that the present values of the current peak values included in time differences T32, T34 and T35 were detected in a state where the output of BPF processing unit 30 was stable.

Figure 27:
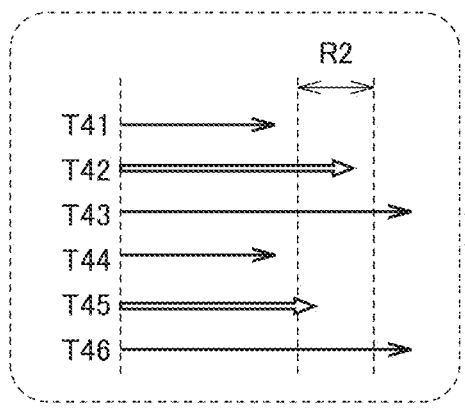
FIG. 27 shows comparison between six voltage peak-to-peak time differences T41 to T46 shown in FIG. 25 and a prescribed range R2.

FIG. 27 shows comparison between six voltage peak-to-peak time differences T41 to T46 shown in FIG. 25 and prescribed range R2. Of six voltage peak-to-peak time differences T41 to T46, time differences T42 and T45 are included within prescribed range R2, whereas the other time differences are not included within prescribed range R2. In this case, it is assumed that the present values of the voltage peak values included in time differences T42 and T45 were detected in a state where the output of BPF processing unit 40 was stable.

In view of the above-described point, when the current peak-to-peak time difference is included within prescribed range R1 and the next voltage peak-to-peak time difference is included within prescribed range R2, impedance calculating unit 50F calculates the impedance using a combination of the present value of the current peak value included in the current peak-to-peak time difference and the present value of the voltage peak value included in the voltage peak-to-peak time difference. In the example shown in FIG. 25, impedance calculating unit 50F calculates the impedance using a combination of the present value of the current peak value included in current peak-to-peak time difference T32 and the present value of the voltage peak value included in voltage peak-to-peak time difference T42, and calculates the impedance using a combination of the present value of the current peak value included in current peak-to-peak time difference T35 and the present value of the voltage peak value included in voltage peak-to-peak time difference T45.

Figure 28:
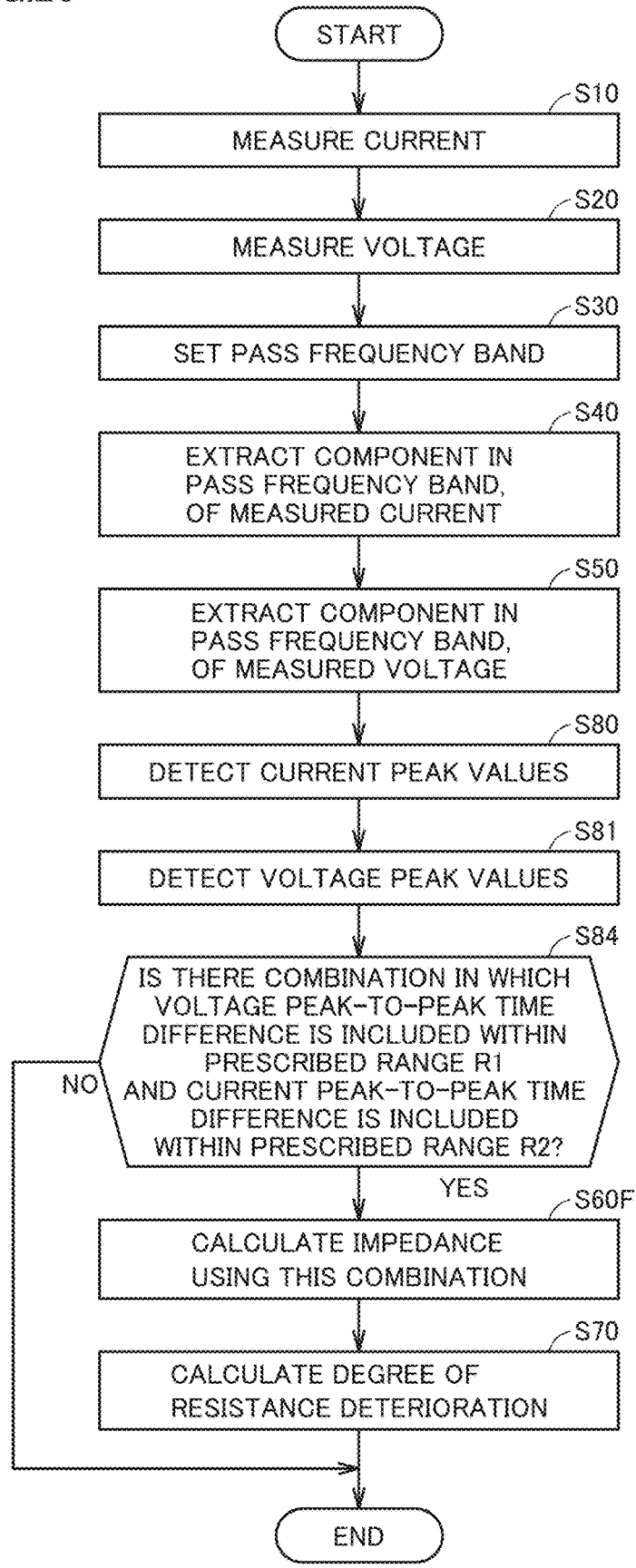
FIG. 28 is a sixth flowchart showing an example process procedure performed by the BMU.

FIG. 28 is a flowchart showing an example process procedure performed by BMU 100F when calculating the impedance and the degree of resistance deterioration of battery 5 according to the seventh embodiment. The flowchart shown in FIG. 28 is different from the flowchart shown in FIG. 20 above in that step S60D in the flowchart shown in FIG. 20 above is replaced with step S60F, and further, step S84 is added. Since the remaining steps (steps having the same numbers as those of the steps shown in FIG. 20 above) in FIG. 28 have already been described, detailed description will not be repeated.

In step S84, BMU 100F determines whether or not there is a combination in which the current peak-to-peak time difference is included within prescribed range R1 and the next voltage peak-to-peak time difference is included within prescribed range R2, among the combinations of the current peak values and the voltage peak values detected in steps S80 and S81.

When there is a combination in which the current peak-to-peak time difference is included within prescribed range R1 and the next voltage peak-to-peak time difference is included within prescribed range R2 (YES in step S84), BMU 100F calculates the impedance using this combination (combination of the present value of the current peak value included in the current peak-to-peak time difference and the present value of the voltage peak value included in the voltage peak-to-peak time difference) (step S60F).

In contrast, when there is no combination in which the current peak-to-peak time difference is included within prescribed range R1 and the next voltage peak-to-peak time difference is included within prescribed range R2 (NO in step S84), BMU 100F ends the process without performing the subsequent steps (calculation of the impedance and the degree of resistance deterioration).

With the above-described configuration, the impedance can be calculated in a state where the outputs of BPF processing units 30 and 40 are stable, and thus, an impedance calculation error can be reduced.

Eighth Embodiment

Figure 29:
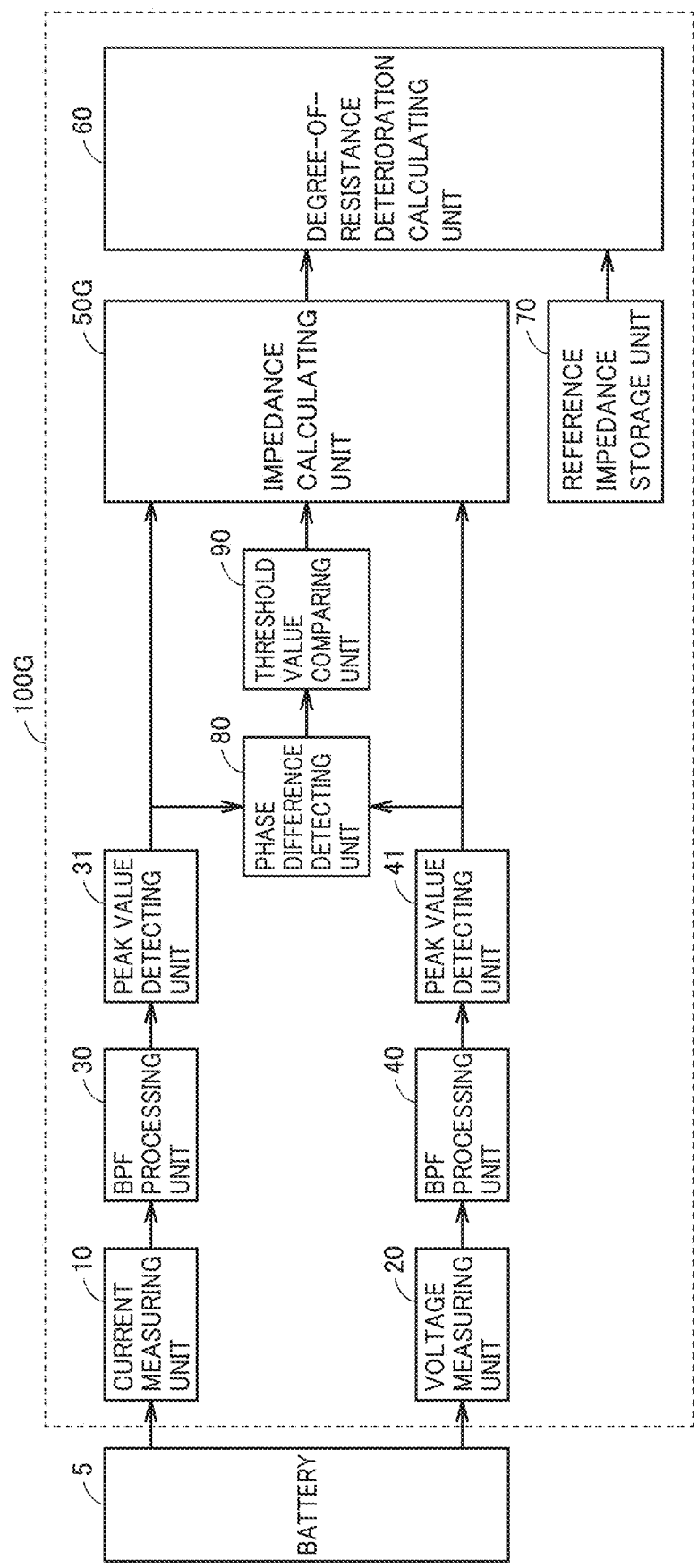
FIG. 29 is a sixth diagram schematically showing an example configuration of a BMU.

FIG. 29 is a diagram schematically showing an example configuration of a BMU 100G according to an eighth embodiment. BMU 100G is different from BMU 100D shown in FIG. 18 above in that a phase difference detecting unit 80 and a threshold value comparing unit 90 are added and impedance calculating unit 50D of BMU 100D is replaced with an impedance calculating unit 50G. Since the remaining configuration of BMU 100G is the same as the configuration of BMU 100D shown in FIG. 18 above, detailed description will not be repeated.

Phase difference detecting unit 80 detects a time period from detection of a current peak value to detection of a next voltage peak value as a phase difference between the current component and the voltage component. Phase difference detecting unit 80 may detect a time period from detection of a voltage peak value to detection of a next current peak value as a phase difference.

Threshold value comparing unit 90 determines whether or not the phase difference detected by phase difference detecting unit 80 is included within a prescribed range R3, and outputs the determination result to impedance calculating unit 50G.

When the determination result by threshold value comparing unit 90 indicates that the phase difference is included within prescribed range R3, impedance calculating unit 50G calculates the impedance using a combination of a current peak value and a voltage peak value that have the phase difference included within prescribed range R3.

Figure 30:
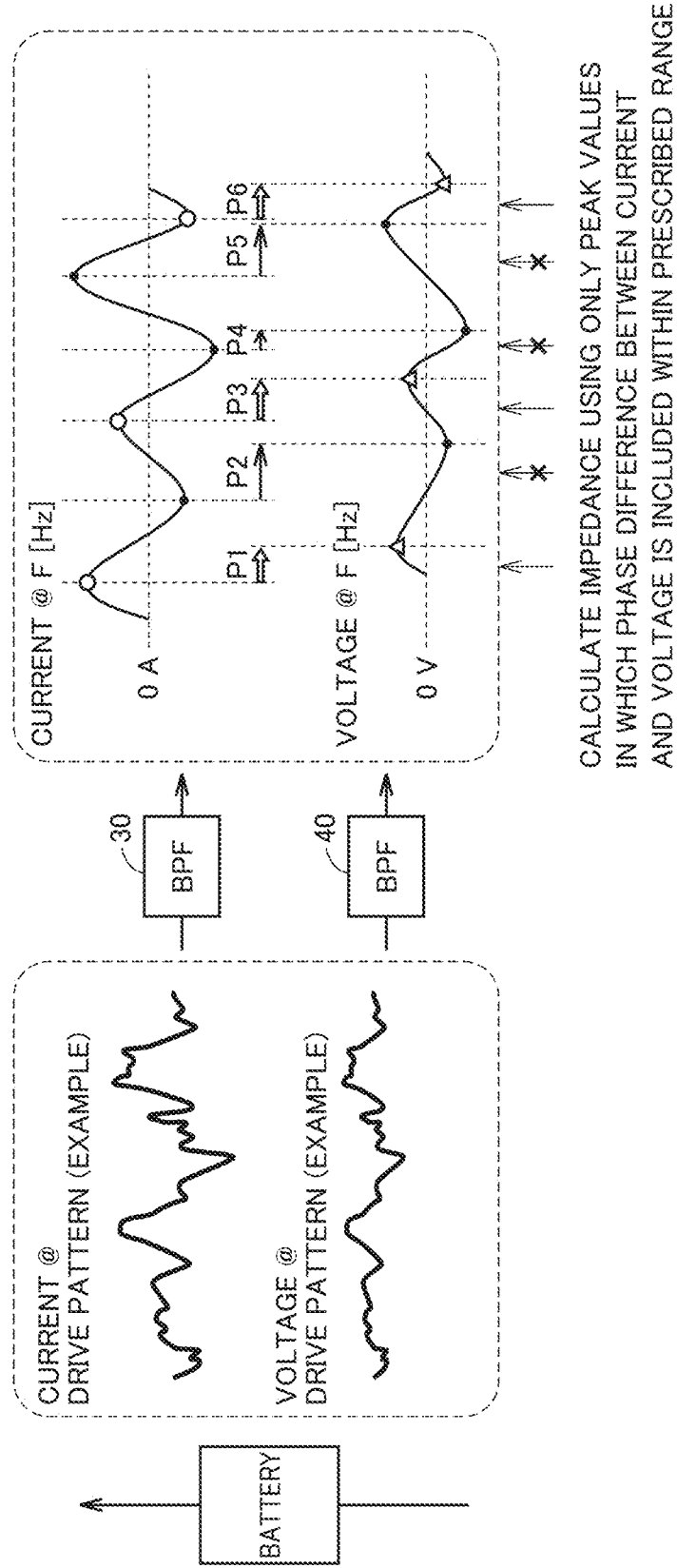
FIG. 30 is a fifth diagram for illustrating a method for calculating an impedance.

FIG. 30 is a diagram for illustrating a method for calculating the impedance by impedance calculating unit 50G. FIG. 30 shows the example in which six phase differences P1 to P6 are detected as the phase difference between the current component and the voltage component (time period from detection of the current peak value to detection of the next voltage peak value).

When the detected phase difference is included within prescribed range R3, impedance calculating unit 50G calculates the impedance.

Figure 31:
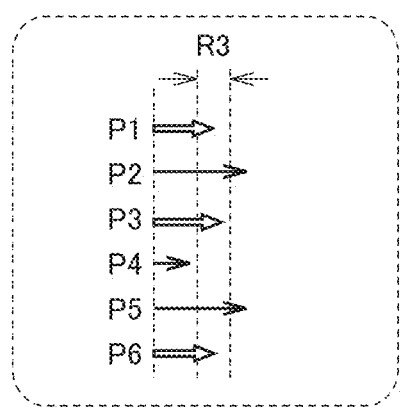
FIG. 31 shows comparison between six phase differences P1 to P6 shown in FIG. 30 and a prescribed range R3.

FIG. 31 shows comparison between six phase differences P1 to P6 shown in FIG. 30 and prescribed range R3. Of six phase differences P1 to P6, phase differences P1, P3 and P6 are included within prescribed range R3, whereas the other phase differences are not included within prescribed range R3. In this case, impedance calculating unit 50G calculates the impedance using a combination of a current peak value and a voltage peak value that have phase difference P1 included within prescribed range R3, a combination of a current peak value and a voltage peak value that have phase difference P3 included within prescribed range R3, and a combination of a current peak value and a voltage peak value that have phase difference P6 included within prescribed range R3.

Figure 32:
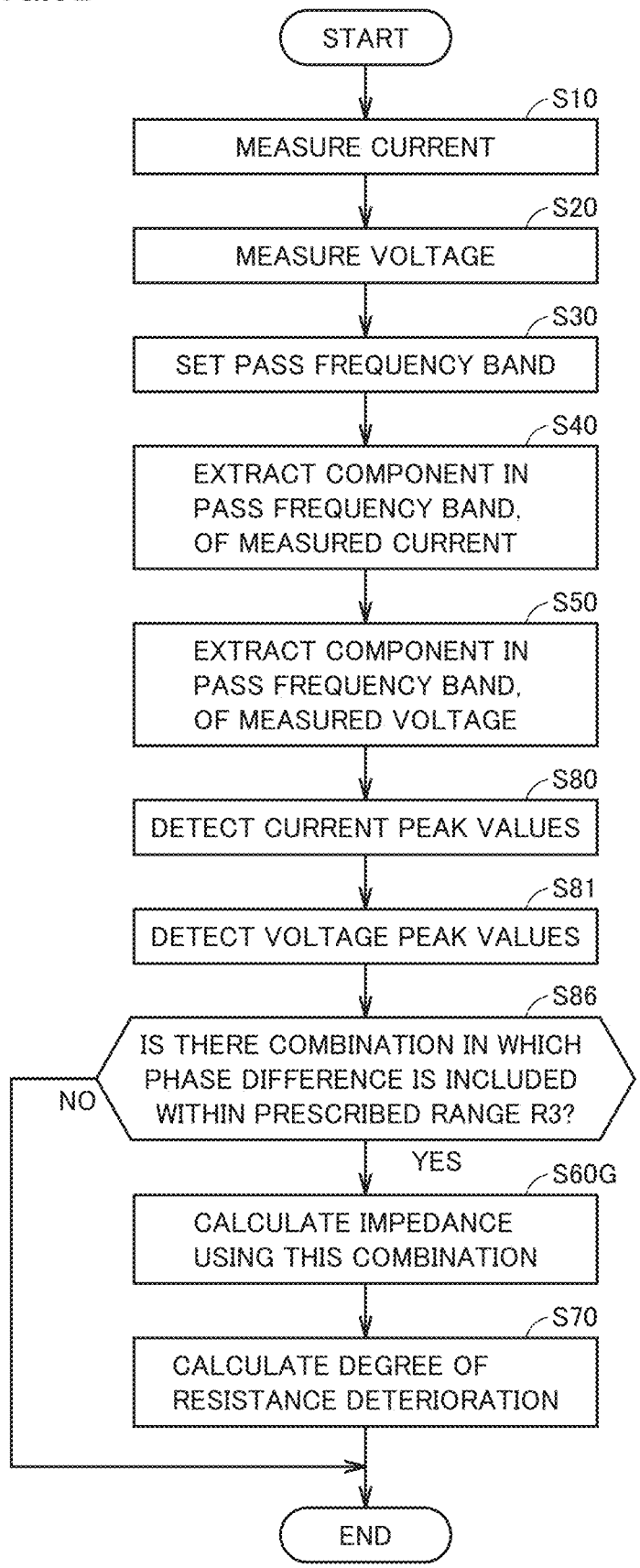
FIG. 32 is a seventh flowchart showing an example process procedure performed by the BMU.

FIG. 32 is a flowchart showing an example process procedure performed by BMU 100G when calculating the impedance and the degree of resistance deterioration of battery 5 according to the eighth embodiment. The flowchart shown in FIG. 32 is different from the flowchart shown in FIG. 20 above in that step S60D in the flowchart shown in FIG. 20 above is replaced with step 560G, and further, step S86 is added. Since the remaining steps (steps having the same numbers as those of the steps shown in FIG. 20 above) in FIG. 32 have already been described, detailed description will not be repeated.

In step S86, BMU 100G determines whether or not there is a combination in which the phase difference is included within prescribed range R3, among the combinations of the current peak values and the voltage peak values detected in steps S80 and S81.

When there is a combination in which the phase difference is included within prescribed range R3 (YES in step S86), BMU 100G calculates the impedance using this combination (step S60G).

In contrast, when there is no combination in which the phase difference is included within prescribed range R3 (NO in step S86), BMU 100G ends the process without performing the subsequent steps (calculation of the impedance and the degree of resistance deterioration).

With the above-described configuration, the impedance can be calculated in a state where the phase difference is stable, and thus, the impedance can be accurately calculated.

[Implementation Example of BPF Processing Units 30 AND 40]

An implementation example of BPF processing units 30 and 40 used in the above-described first to eighth embodiments will be described.

Each of BPF processing units 30 and 40 may be implemented by an analog circuit, or may be implemented by digital processing (software processing).

Figure 33:
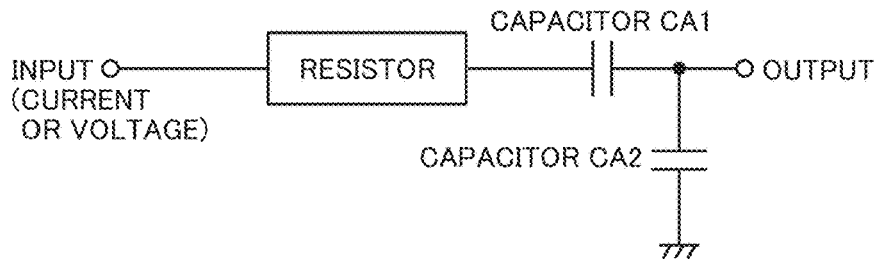
FIG. 33 shows an implementation example of the BPF processing unit by an analog circuit.

FIG. 33 shows an implementation example of each of BPF processing units 30 and 40 by an analog circuit. When each of BPF processing units 30 and 40 is implemented by an analog circuit, a resistor and a capacitor CA1 may be connected in series between an input and an output, and further, a capacitor CA2 may be arranged between a ground and a connection node of capacitor CA1 and the output, as shown in FIG. 33, for example.

Figure 34:
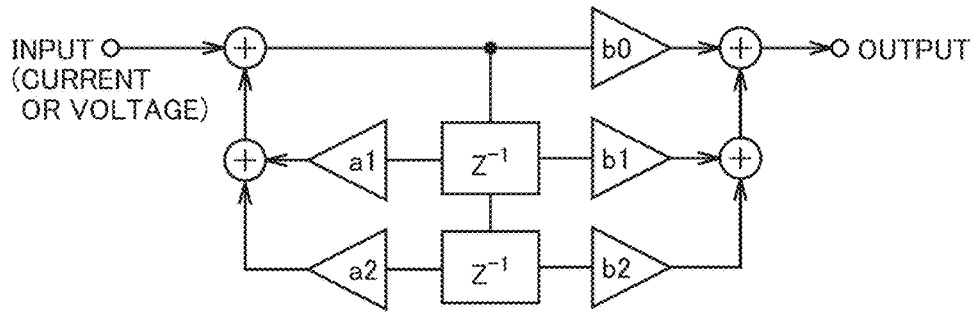
FIG. 34 shows an implementation example of the BPF processing unit by digital processing.

FIG. 34 shows an implementation example of each of BPF processing units 30 and 40 by digital processing. FIG. 34 shows the example in which each of BPF processing units 30 and 40 is implemented by a biquadratic infinite impulse response (IIR) filter. In this case, the pass frequency band can be switched by fixing the processing configuration to a biquadratic configuration and changing only the filter coefficients (a1, a2, b0, b1, and b2 shown in FIG. 34) used in digital processing (software processing). In other words, the filter coefficients used in digital processing (software processing), not pass frequency F itself, may be stored in the memory as the information for identifying the pass frequency band.

Each of LPF processing units 5a and 5b may also be implemented by an analog circuit, or may be implemented by digital processing (software processing).

Figure 35:
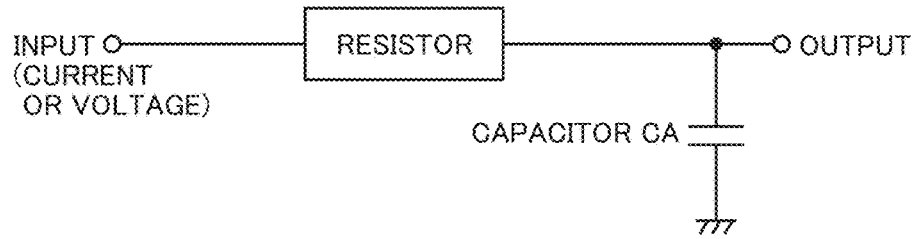
FIG. 35 shows an implementation example of the LPF processing unit by an analog circuit.

FIG. 35 shows an implementation example of each of LPF processing units 5a and 5b by an analog circuit. When each of LPF processing units 5a and 5b is implemented by an analog circuit, a resistor may be arranged between an input and an output, and further, a capacitor C may be arranged between a ground and a connection node of the resistor and the output, as shown in FIG. 35, for example.

[Setting Example of Reference Impedance]

In the above-described first to eighth embodiments, the degree of resistance deterioration of battery 5 is calculated using the calculated impedance and the reference impedance stored in reference impedance storage unit 70.

The reference impedance used to calculate the degree of resistance deterioration can, for example, be the AC impedance in the pass frequency band that is preliminarily calculated using one or more batteries 5.

For example, an impedance corresponding to a begin of life (BOL), which is a state in which battery 5 is brand-new, may be stored as a first reference impedance in reference impedance storage unit 70.

Figure 36:
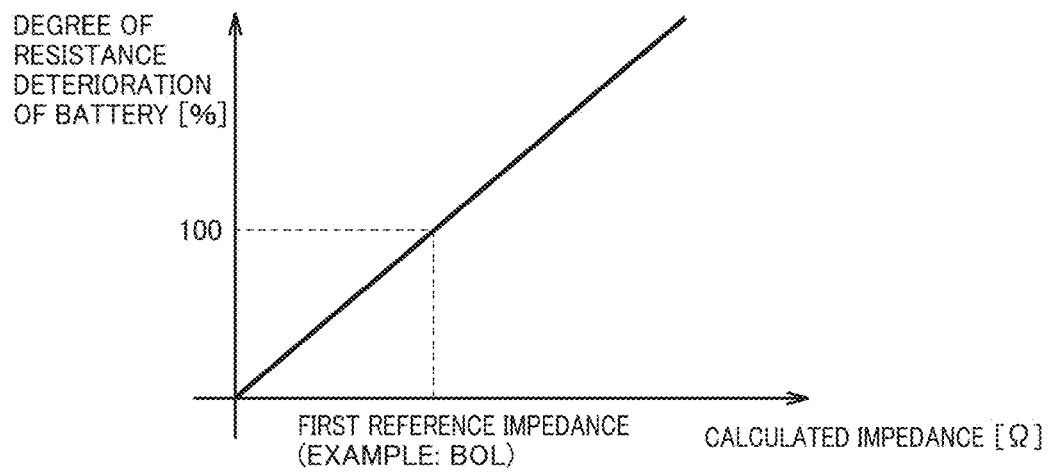
FIG. 36 is a first diagram showing an example method for calculating a degree of resistance deterioration of a battery.

FIG. 36 is a diagram showing an example method for calculating the degree of resistance deterioration of battery 5 using the first reference impedance corresponding to the BOL. As shown in FIG. 36, assuming that the degree of resistance deterioration of the battery when the calculated impedance is the first reference impedance is 100%, the degree of resistance deterioration of battery 5 can be calculated to increase in proportion to the calculated impedance.

Alternatively, a plurality of reference impedances corresponding to a plurality of states of battery 5, respectively, may be stored in reference impedance storage unit 70. For example, the above-described first reference impedance corresponding to the BOL and a second reference impedance corresponding to an end of life (EOL), which is a state in which battery 5 is at the end of life, may be stored in reference impedance storage unit 70.

FIG. 37 is a diagram showing an example method for calculating the degree of resistance deterioration of battery 5 using the first reference impedance corresponding to the BOL and the second reference impedance corresponding to the EOL. As shown in FIG. 37, assuming that the degree of resistance deterioration of the battery when the calculated impedance is the first reference impedance is 100%, and the degree of resistance deterioration of the battery when the calculated impedance is the second reference impedance is 200%, the degree of resistance deterioration of the battery can be estimated to increase in proportion to the calculated impedance.

Although the embodiments of the present disclosure have been described, it should be understood that the embodiments disclosed herein are illustrative and non-restrictive in every respect. The scope of the present disclosure is defined by the terms of the claims and is intended to include any modifications within the scope and meaning equivalent to the terms of the claims.

What is claimed is:

1. A state calculating apparatus for a chargeable and dischargeable battery, the state calculating apparatus comprising:
   a first measuring unit configured to measure a current charged to and discharged from the battery;
   a second measuring unit configured to measure a voltage of the battery during measurement of the current by the first measuring unit;
   a first processing unit configured to extract a current component, the current component being a component in a prescribed frequency band, of the current measured by the first measuring unit;
   a second processing unit configured to extract a voltage component, the voltage component being a component in the prescribed frequency band, of the voltage measured by the second measuring unit; and
   a calculating unit configured to calculate an impedance of the battery using the current component extracted by the first processing unit and the voltage component extracted by the second processing unit,
   wherein
   the first processing unit and the second processing unit are configured to
      change the prescribed frequency band,
      search for a frequency band in which a phase difference between the current and the voltage of the battery has a local minimum, and
      set the searched frequency band as the prescribed frequency band.

2. The state calculating apparatus for the battery according to claim 1, further comprising:
   a storage unit that stores a reference impedance of the battery; and
   an estimating unit configured to estimate a degree of resistance deterioration of the battery using the impedance calculated by the calculating unit and the reference impedance stored in the storage unit.

3. The state calculating apparatus for the battery according to claim 1, wherein
   the prescribed frequency band is set to include a frequency at which a phase difference between the current and the voltage of the battery has a local minimum in a phase characteristic of the battery.

4. The state calculating apparatus for the battery according to claim 1, wherein
   the first processing unit and the second processing unit are configured to change the prescribed frequency band in accordance with at least one of a temperature of the battery, an amount of power storage of the battery, or a degree of deterioration of the battery.

5. The state calculating apparatus for the battery according to claim 1, further comprising:
   a third processing unit provided between the battery and the first measuring unit, to perform anti-aliasing filtering on the current input from the battery; and
   a fourth processing unit provided between the battery and the second measuring unit, to perform anti-aliasing filtering on the voltage input from the battery, wherein
   the prescribed frequency band is set using a phase characteristic of a combination of the battery, the third processing unit and the fourth processing unit.

6. The state calculating apparatus for the battery according to claim 1, further comprising:

a first detecting unit provided between the first processing unit and the calculating unit, to detect, as a current peak value, at least one of a local maximum value or a local minimum value of the current component extracted by the first processing unit; and a second detecting unit provided between the second processing unit and the calculating unit, to detect, as a voltage peak value, at least one of a local maximum value or a local minimum value of the voltage component extracted by the second processing unit, wherein the calculating unit is configured to calculate the impedance using the current peak value and the voltage peak value.

7. The state calculating apparatus for the battery according to claim 6, wherein in response to the current peak value being larger than a first threshold value and the voltage peak value being larger than a second threshold value, the calculating unit is configured to calculate the impedance using the current peak value and the voltage peak value.

8. The state calculating apparatus for the battery according to claim 6, wherein in response to (i) a time period from detection of a previous value of the current peak value to detection of a present value of the current peak value being included in a first range and (ii) a time period from detection of a previous value of the voltage peak value to detection of a present value of the voltage peak value being included in a second range, the calculating unit is configured to calculate the impedance using the present value of the current peak value and the present value of the voltage peak value.

9. The state calculating apparatus for the battery according to claim 6, wherein in response to a time period from detection of one of the current peak value and the voltage peak value to detection of the other being included in a prescribed range, the calculating unit is configured to calculate the impedance using the current peak value and the voltage peak value.

10. The state calculating apparatus for the battery according to claim 1, wherein each of the first processing unit and the second processing unit is implemented by an analog circuit.

11. The state calculating apparatus for the battery according to claim 1, wherein each of the first processing unit and the second processing unit is implemented by software processing.

12. The state calculating apparatus for the battery according to claim 11, wherein the first processing unit and the second processing unit are configured to change the prescribed frequency band by changing a filter coefficient used in the software processing.

13. The state calculating apparatus for the battery according to claim 2, wherein the reference impedance stored in the storage unit is the impedance corresponding to the current in the prescribed frequency band and the voltage in the prescribed frequency band, the reference impedance being preliminarily calculated using the at least one battery.

14. The state calculating apparatus for the battery according to claim 2, wherein a plurality of reference impedances corresponding to a plurality of states of the battery, respectively, are stored in the storage unit, and the estimating unit is configured to estimate the degree of resistance deterioration of the battery using the plurality of reference impedances.

15. The state calculating apparatus for the battery according to claim 14, wherein the plurality of states of the battery include a first state in which the battery is brand-new and a second state in which the battery is at an end of life.

16. A state calculating method for a chargeable and dischargeable battery, the method comprising:

measuring a current charged to and discharged from the battery;

measuring a voltage of the battery during measurement of the current;

extracting a current component, the current component being a component in a prescribed frequency band, of the measured current;

extracting a voltage component, the voltage component being a component in the prescribed frequency band, of the measured voltage; and calculating an impedance of the battery using the extracted current component and the extracted voltage component, wherein the method further comprises:

changing the prescribed frequency band, searching for a frequency band in which a phase difference between the current and the voltage of the battery has a local minimum, and setting the searched frequency band as the prescribed frequency band.

* * * * *